US012787760B2

(12) United States Patent
Chen et al.

(10) Patent No.: US 12,787,760 B2
(45) Date of Patent: Nov. 3, 2026

(54) SEMICONDUCTOR DEVICES WITH ELECTRICAL FUSES AND METHODS OF FABRICATING THE SAME

(71) Applicant: Taiwan Semiconductor Manufacturing Company, Ltd., Hsinchu (TW)

(72) Inventors: Chia-Chung Chen, Hsinchu (TW); Meng-Sheng Chang, Hsinchu (TW); Chung-Sheng Yuan, Hsinchu (TW); Yi-Kan Cheng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 637 days.

(21) Appl. No.: 18/333,189

(22) Filed: Jun. 12, 2023

(65) Prior Publication Data

US 2024/0297115 A1 Sep. 5, 2024

Related U.S. Application Data

(60) Provisional application No. 63/487,975, filed on Mar. 2, 2023.

(51) Int. Cl.
*H10W 20/49* (2026.01)
*G11C 17/16* (2006.01)
(Continued)

(52) U.S. Cl.
CPC ........... *H10W 20/493* (2026.01); *G11C 17/16* (2013.01); *H10B 20/25* (2023.02); *H10W 20/42* (2026.01);
(Continued)

(58) Field of Classification Search
CPC ..... G11C 17/16; H01L 23/5256; H10B 20/25; H10W 20/42; H10W 20/435;
(Continued)

(56) References Cited

U.S. PATENT DOCUMENTS

| | | | |
|---|---|---|---|
| 6,400,008 | B1 | 6/2002 | Farnworth |
| 11,450,751 | B2 | 9/2022 | Su et al. |

(Continued)

FOREIGN PATENT DOCUMENTS

| | | | |
|---|---|---|---|
| KR | 10-2010-0051810 | A | 5/2010 |
| KR | 10-2017-0063325 | A | 6/2017 |

(Continued)

OTHER PUBLICATIONS

Office Action issued in German Appl. No. 102023129299.4 dated Jul. 31, 2025.

(Continued)

*Primary Examiner* — Wasiul Haider
(74) *Attorney, Agent, or Firm* — Foley & Lardner LLP

(57) ABSTRACT

A semiconductor structure includes a substrate having a first surface and a second surface opposite the first surface. The semiconductor structure includes a semiconductor device disposed on the first surface. The semiconductor structure includes a metallization layer disposed on the second surface. The semiconductor structure includes a first conductive via and a second conductive via coupled in parallel to the metallization layer, the first conductive via and the second conductive via extending from the second side toward the first side. The semiconductor structure further includes an electrical fuse disposed over the semiconductor device and coupled to the first and second conductive vias.

20 Claims, 17 Drawing Sheets

(51) Int. Cl.

| | |
|---|---|
| ***H10B 20/25*** | (2023.01) |
| ***H10W 20/41*** | (2026.01) |
| ***H10W 20/42*** | (2026.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |

(52) U.S. Cl.
CPC ........ *H10W 20/435* (2026.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01)

(58) Field of Classification Search
CPC . H10W 20/023; H10W 20/20; H10W 70/095; H10W 20/493; H10W 20/427; H10W 20/4403; H10D 30/6735; H10D 30/014; H10D 30/43; H10D 30/6757; H10D 62/121; H10D 64/017
See application file for complete search history.

(56) References Cited

U.S. PATENT DOCUMENTS

| | | | | |
|---|---|---|---|---|
| 11,552,069 | B1 | 1/2023 | Chang et al. | |
| 2012/0112312 | A1 | 5/2012 | Perry et al. | |
| 2015/0252467 | A1 | 9/2015 | Allen et al. | |
| 2020/0388571 | A1* | 12/2020 | Huang | G01R 31/74 |
| 2021/0391318 | A1* | 12/2021 | Peng | H10D 89/10 |
| 2022/0122960 | A1 | 4/2022 | Yang et al. | |
| 2022/0352186 | A1 | 11/2022 | Chang et al. | |
| 2022/0367490 | A1 | 11/2022 | Chang et al. | |
| 2023/0043443 | A1 | 2/2023 | Chang et al. | |

FOREIGN PATENT DOCUMENTS

| | | | |
|---|---|---|---|
| KR | 10-2019-0109188 | A | 9/2019 |
| KR | 10-2020-0106337 | A | 9/2020 |
| KR | 10-2021-0002344 | A | 1/2021 |
| KR | 10-2022-0092963 | A | 7/2022 |
| TW | 202249255 | A | 12/2022 |
| TW | 202301338 | A | 1/2023 |

OTHER PUBLICATIONS

Office Action issued in connection with Taiwan Appl. No. 112129873 dated Mar. 12, 2024.
Office Action issued in connection with Korean Appl. No. 10-2023-0168628 dated Feb. 13, 2025.
Office Action issued in connection with Korean Appl. No. 10-2024-0018822 dated Oct. 22, 2025.
Office Action issued in connection with Korean Appl. No. 10-2023-0168628 dated Oct. 1, 2025.

* cited by examiner

SEMICONDUCTOR DEVICES WITH ELECTRICAL FUSES AND METHODS OF FABRICATING THE SAME

CROSS-REFERENCE TO RELATED APPLICATION

This application claims priority to and the benefit of U.S. Provisional Application No. 63/487,975, filed Mar. 2, 2023, titled "SEMICONDUCTOR DEVICES WITH EFUSES AND METHODS OF FABRICATING THE SAME," which is incorporated herein by reference in its entirety for all purposes.

BACKGROUND

Electrical fuses (eFuses) are devices used to reprogram integrated circuit (IC) chips, such as computer chips. In some instances, eFuses can be used to provide in-chip performance tuning. If a component of the IC chip fails, for example, an eFuse can be blown to change behavior or to switch in a back-up system. An IC chip may be provided with an array of eFuse cells each having a one-transistor-one-resistor, or 1T1R, architecture. For example, each eFuse cell may include one MOS (e.g., an n-type MOS or NMOS) transistor (1T) operatively coupled to one fuse element, or resistor, (1R). An eFuse may be generally implemented by a weak trace coupled in a current path to a power source such that when a sufficiently high level of voltage (power) or current is provided to the eFuse, the eFuse would fail before other circuits (or other circuit components) do, thereby tuning the behavior of the IC chip. While existing eFuse devices have generally been adequate, they are not entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
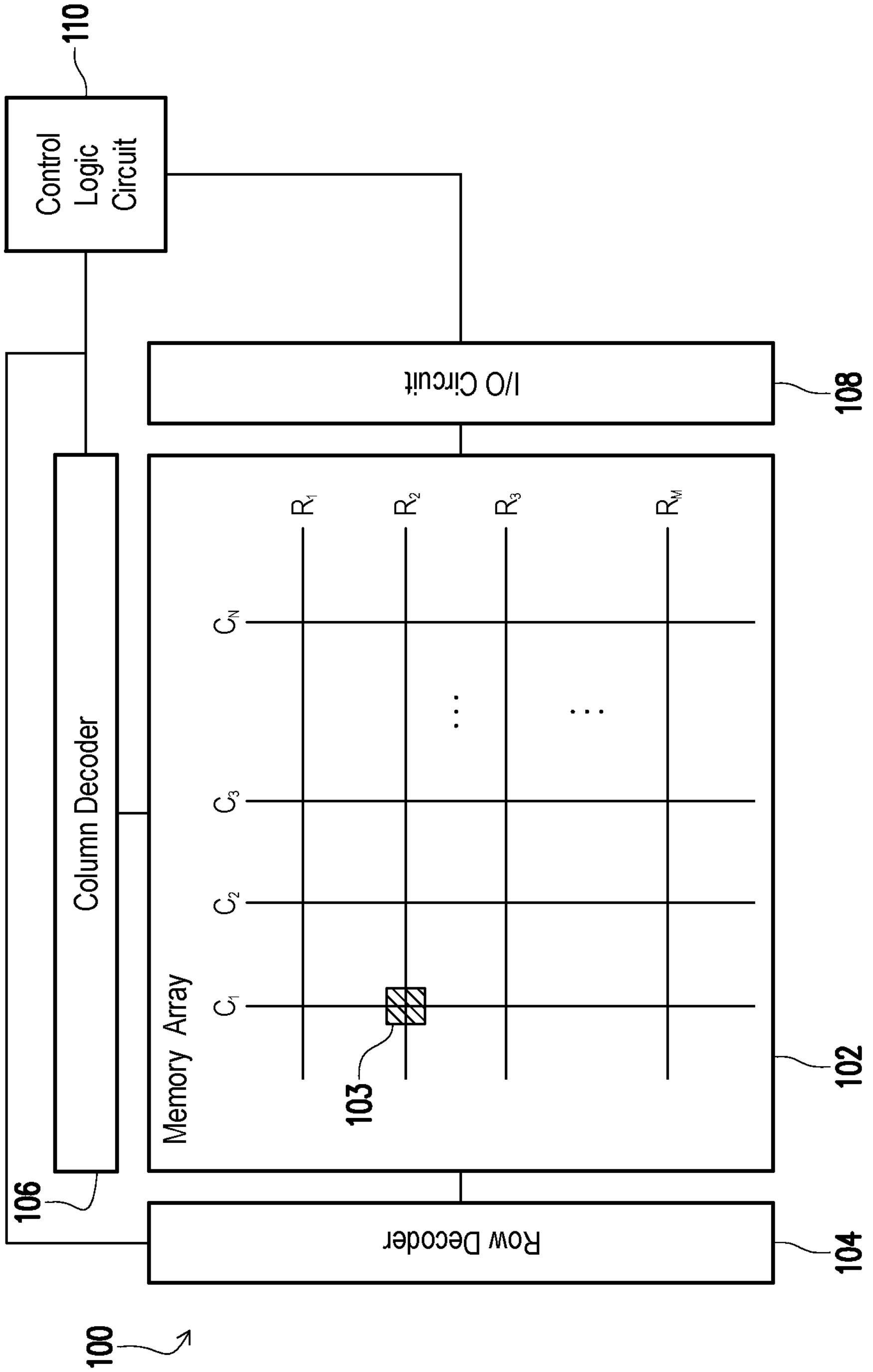
FIG. 1 illustrates a block diagram of a semiconductor device including a plurality of memory cells, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A one-time-programmable (OTP) memory device is a type of non-volatile memory device utilized in ICs for adjusting circuit behavior after fabrication of the ICs is completed. For example, the OTP memory device is used for tuning analog circuitry by trimming a capacitive or resistive value of an analog circuit or enabling and disabling portions of the system. Another use is for providing repair information that controls the usage of redundant cells in replacing defective cells of a memory array. A recent trend is that the same product is likely to be manufactured in different fabrication facilities though in a common process technology. Despite best engineering efforts, it is likely that each facility will have a slightly different process. Usage of OTP memory devices allows independent optimization of the product functionality for each manufacturing facility.

As IC technology advances, feature sizes (e.g., the width of interconnect structures) have been decreasing, allowing for more circuitry to be implemented in an IC. There are challenges associated with implementing OTP memory devices such as, for example, eFuses, in an IC. In applications where components of an eFuse (or an eFuse cell) are formed over a frontside of an IC chip and power (or voltage) is provided to the fuse element of the eFuse from a backside of the IC chip (substrate), higher resistance may be exhibited by one or more vias configured to transmit the power from the backside to the frontside of the chip due to the vias' small diameters (i.e., cross-sectional areas). Such increase in resistance makes it difficult for the current in the vias to rise to a sufficiently high level and cause the fuse element to fail. As a result, it can become challenging to program the IC components coupled to the eFuse. Thus, the existing eFuses in OTP memory devices have not been entirely satisfactory.

The present disclosure provides various embodiments of a semiconductor device including an eFuse cell coupled to a backside power source (or power rails) through a number of vias with reduced resistance collectively such that the current provided to the fuse element may be increased to meet a program current of the eFuse.

FIG. 1 illustrates an example block diagram of a semiconductor (e.g., memory) device 100, in accordance with various embodiments. In the illustrated embodiment of FIG. 1, the semiconductor device 100 includes a memory array 102, a row decoder 104, a column decoder 106, an input/output (I/O) circuit 108, and a control logic circuit 110. Despite not being explicitly shown in FIG. 1, the components of the semiconductor device 100 may be operatively coupled to each other and to the control logic circuit 110. For example, the control logic circuit 110, the I/O circuit 108, the column decoder 106, and the row decoder 104 may be electrically coupled to the memory array 102. Although, in the illustrated example of FIG. 1, the components are shown as separate blocks for the purpose of clear illustration, in some other embodiments, some or all of the components may be integrated together. For example, the memory array 102 may include an embedded I/O circuit 108.

The memory array 102 is a hardware component that stores data. In one aspect, the memory array 102 is embodied as a semiconductor memory device. The memory array 102 includes a plurality of memory cells (or otherwise storage units) 103. The memory array 102 includes a number of rows $R_1$, $R_2$, $R_3$ . . . $R_M$, each extending in a first direction (e.g., X-direction) and a number of columns $C_1$, $C_2$, $C_3$ . . . $C_N$, each extending in a second direction (e.g., Y-direction). Each of the rows/columns may include one or more conductive structures. In some embodiments, each memory cell 103 is arranged in the intersection of a corresponding row and a corresponding column and can be operated according to voltages or currents through the respective conductive structures of the column and row.

In accordance with various embodiments of the present disclosure, each memory cell 103 is implemented as OTP memory cell, such as an eFuse cell (hereafter referred to as eFuse cell 103) that includes a fuse resistor and an access transistor coupled to each other in series. The access transistor can be coupled to (e.g., gated by) a WL. The access transistor can be turned on/off to enable/disable an access (e.g., program, read) to the corresponding fuse resistor. For example, upon being selected, the access transistor of the selected fuse cell is turned on to generate a program or read path conducting through its fuse resistor and itself.

The row decoder 104 is a hardware component that can receive a row address of the memory array 102 and assert a conductive structure (e.g., a word line) at that row address. The column decoder 106 is a hardware component that can receive a column address of the memory array 102 and assert one or more conductive structures (e.g., a bit line, a source line) at that column address. The I/O circuit 108 is a hardware component that can access (e.g., read, program) each of the eFuse cells 103 asserted through the row decoder 104 and column decoder 106. The control logic circuit 110 is a hardware component that can control the coupled components (e.g., 102 through 108).

Figure 2:
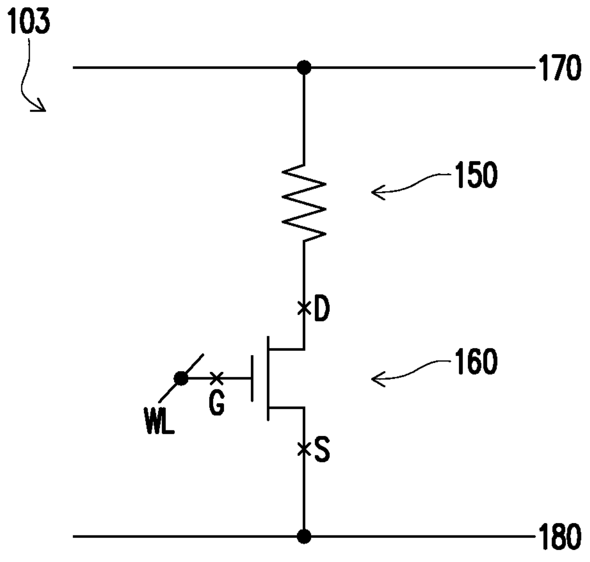
FIG. 2 illustrates a circuit diagram of an eFuse cell of the semiconductor device of FIG. 1, in accordance with some embodiments.

FIG. 2 illustrates an example configuration of an eFuse cell (e.g., 103 of FIG. 1) in accordance with some embodiments. In the example of FIG. 2, the eFuse cell 103 is implemented as a one-transistor-1-resistor (1T1R) configuration, for example, a fuse resistor (or a fuse element) 150 and an access transistor 160 coupled to each other in series, where the fuse resistor 150 is coupled to a power source 170 and a source of the access transistor 160 is coupled to a source line (SL), which is grounded. It, however, should be understood that any of other fuse configurations that exhibit the fuse characteristic may be implemented by the eFuse cell 103 including, for example, a 2-diodes-1-resistor (2D1R) configuration, a many-transistors-one-resistor (manyT1R) configuration, or the like, while remaining within the scope of the present disclosure.

In accordance with various embodiments of the present disclosure, the fuse resistor 150 and the access transistor 160 are formed on the same side, e.g., the frontside, of a semiconductor substrate, while the power source 170 is routed from an opposite side, e.g., the backside, of the semiconductor substrate. For example, the access transistor 160 is formed along the frontside surface of a semiconductor substrate as a part of front-end-of-line (FEOL) processing. Subsequent to the FEOL processing, a number of metallization layers, each of which includes a number of interconnect (e.g., metal) structures, are formed as a part of back-end-of-line (BEOL) processing. Middle-end-of-line (MEOL) processing may be implemented to form various conductive features (e.g., source/drain contacts and gate contacts) to interconnect portions of the FEOL features with the BEOL features. The fuse resistor 150 may be formed of one or more of the metal structures in one of the metallization layers that are disposed over the access transistor 160. In the present embodiments, the fuse resistor 150 is formed in a $M_2$metallization layer, as discussed in detail below. Accordingly, the access transistor 160 and the fuse resistor 150 may be formed through the FEOL processing and BEOL processing (on the frontside), respectively.

On the other hand, the fuse resistor 150 is connected to the power source 170 that is formed of a number of metallization layers including interconnect (e.g., metal) structures disposed on the backside of the semiconductor substrate (when flipping the substrate upside down). The metallization layers formed on the backside of the semiconductor substrate may be referred to as super power rails (SPRs) or backside power rails. For purposes of clarity, the metal structure(s) configured as the fuse resistor 150 and the metal structure(s) configured as the power source 170 are herein referred to as frontside metal structure(s) and backside metal structure(s), respectively.

With the fuse resistor 150 of the eFuse cell 103 embodied as a (frontside) metal structure, the fuse resistor 150 may exhibit an initial resistance value (or resistivity), for example, as fabricated. To program the eFuse cell 103, the access transistor 160 (if embodied as an n-type MOS transistor) is turned on by applying a voltage signal, for example, that corresponds to a logic high state through a word line (WL) to a gate terminal of the access transistor 160. Concurrently or subsequently, a sufficiently high voltage (or current) signal is applied to one of the terminals of the fuse resistor 150 through the power source 170 disposed on the backside of the semiconductor substrate. With the access transistor 160 turned on, a programming (e.g., current) path can be provided from the power source 170, through the fuse resistor 150 and the access transistor 160, and to the SL 180. Consequently, the fuse resistor 150 can transition from a first state (e.g., a short circuit) to a second state (e.g., an open circuit), which causes the eFuse cell 103 to irreversibly transition from a first logic state (e.g., logic 0) to a second logic state (e.g., logic 1). The logic state can be read out by applying a relatively low voltage signal on the power source 170 and turning on the access transistor 160 to provide a (e.g., reading) path.

Figure 3:
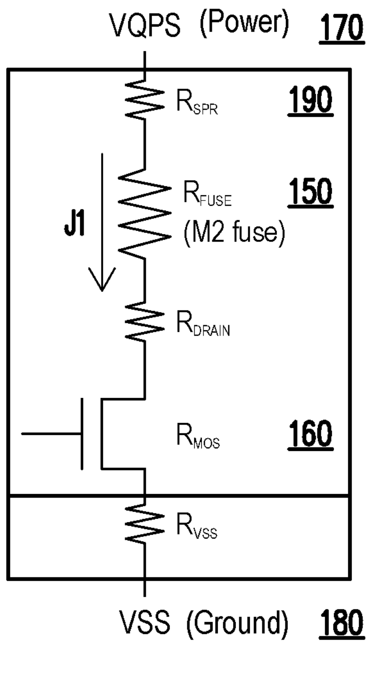
FIG. 3 illustrates a schematic programming path of the eFuse cell of FIG. 2, in accordance with some embodiments.

FIG. 3 illustrates a programming (e.g., current) path J1 extending from the power source 170 to the SL 180. Along the current path J1, there is a resistance $R_{SPR}$ associated with interconnect structures 190 (discussed in detail below), which transmit the current from the power source 170 to the fuse resistor 150. A resistance $R_{FUSE}$ of the programming path J1 between the interconnect structures 190 and the drain of the access transistor 160 is associated with the fuse resistor 150, which is also referred to as an $M_2$ fuse for being formed in the $M_2$ metallization layer over the frontside of the semiconductor substrate. The resistance of the eFuse cell 103 includes the resistance $R_{FUSE}$, a resistance $R_{DRAIN}$ of the connection between the fuse resistor 150 and the access transistor 160, and a resistance $R_{MOS}$ associated with the connection between the drain and SL 180, which has a resistance of $R_{VSS}$.

In existing implementations, eFuse cells (e.g., eFuse cells 103) powered by SPRs often utilize a backside via $V_B$ (see FIG. 5) to transmit current from the backside to the frontside in response to an applied voltage signal on the SPRs. The backside via $V_B$ may be formed to couple the SPRs to a bottom (e.g., the backside) of the source or the drain of the access transistor (e.g., the access transistor 160) through the semiconductor substrate. The terms "couple" and "connect," as used herein, refer to physical and/or electrical connection between two components with or without any intervening layers or components formed therebetween. As feature sizes continue to decrease, a diameter, and thus a cross-sectional area, of the backside via $V_B$ also decreases. Since resistance generally varies inversely with the cross-sectional area of a conductor, a decreased diameter results in the resistance of the backside via $V_B$ to increase and the current through the backside via $V_B$ to decrease, making it difficult for the current to reach the program current of the eFuse cell and blow the fuse resistor. For at least this reason, improvement in providing lower-resistance interconnect structures (e.g., the interconnect structure 190) between the SPRs and the eFuse cells may be desired. The present embodiments provide a hybrid interconnect structure including at least a feedthrough via (FTV) connected in parallel with the backside via $V_B$ to achieve a lowered resistance $R_{SPR}$, and accordingly, increased current to be transmitted from the SPRs on the backside to the eFuse cell (e.g., the fuse resistor) on the frontside.

Figure 4:
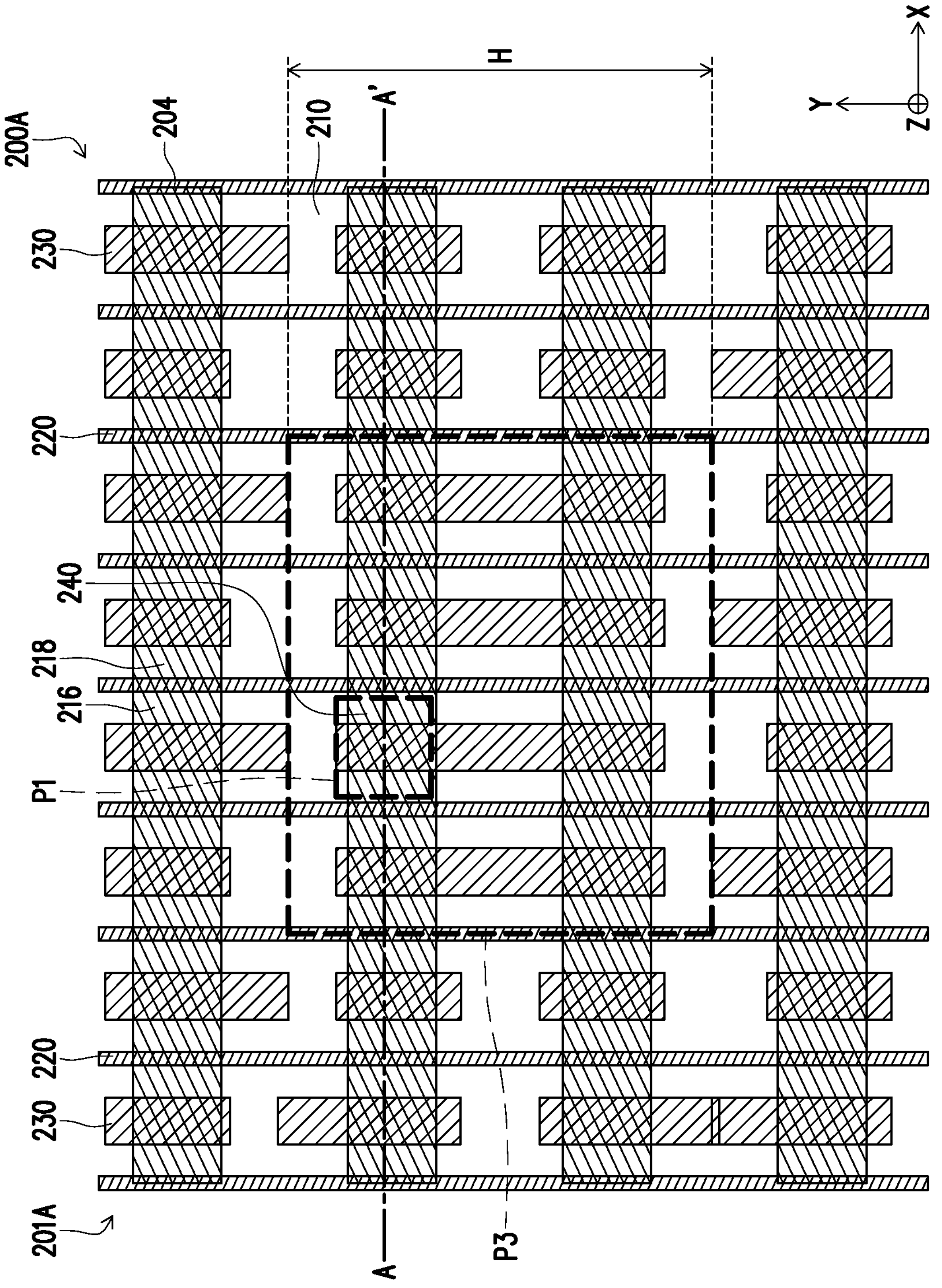
FIG. 4 illustrates a top view of a semiconductor device including a backside via, in accordance with some embodiments.

FIG. 4 illustrates a top view of an example semiconductor device 200A. The semiconductor device 200A includes a plurality of active regions (also each referred to as an oxide diffusion, or OD, region) 204 over a frontside 201A of a substrate (or semiconductor substrate) 202 (see FIG. 5) and separated by a dielectric layer 210. The semiconductor device 200A includes a plurality of gate structures 220 engaged with channel regions of the active regions 204 to form various devices (e.g., transistors), where each channel region is interposed between a pair of source/drain structures 216 and 218. The gate structures 220 and the active regions 204 are oriented substantially perpendicular to one another. The semiconductor device 200A further includes a plurality of source/drain contacts 230 coupling to the source/drain structures 216 and 218. An area enclosed in a region P1 of FIG. 4 corresponds to a cross-sectional area of a backside via ($V_B$) 240, which is less than or equal to an area of a backside (or bottom surface) of the source/drain structure 216/218 to which the backside via 240 is coupled.

Figure 5:
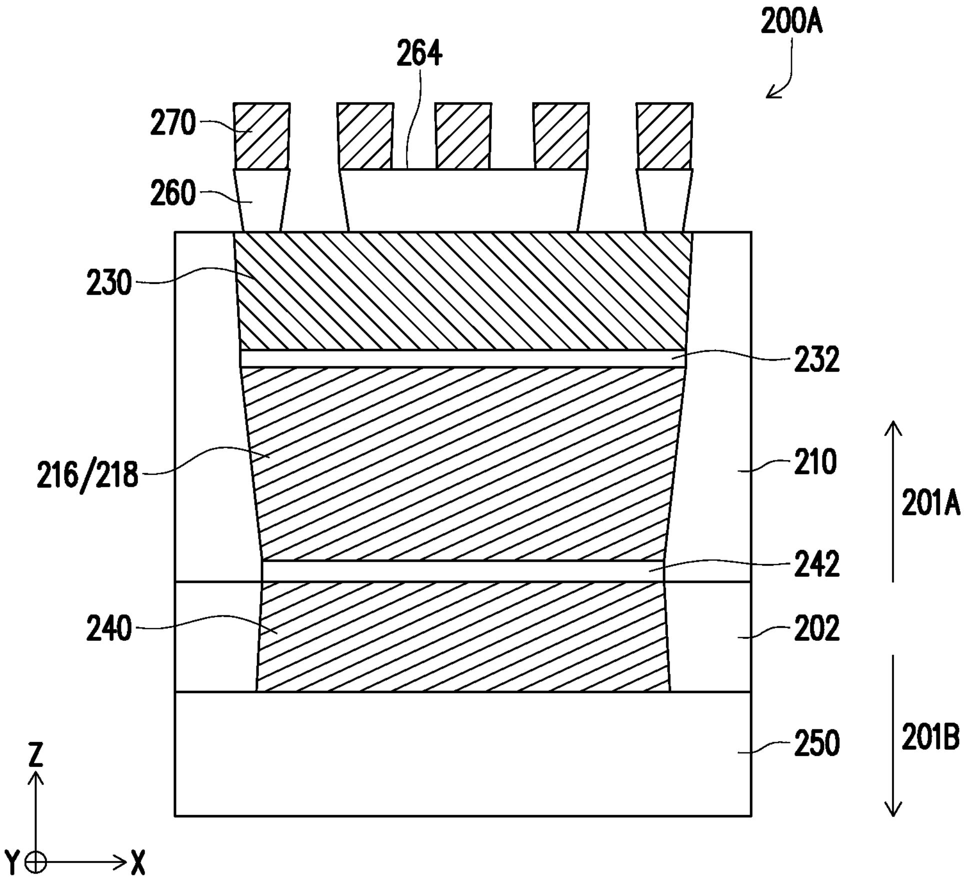
FIG. 5 illustrates a cross-sectional view of the semiconductor device taken along line AA' of FIG. 4, in accordance with some embodiments.

Referring to FIG. 5, which illustrates a cross-sectional view of the semiconductor device 200A along line AA' as shown in FIG. 4, the backside via 240 extends through the substrate 202 to couple a backside metallization layer ($BM_0$) 250 with the source/drain structure 216/218, where the backside metallization layer 250 is disposed over a backside 201B of the substrate 202. In this regard, the backside metallization layer 250 may be considered a part of the SPRs (e.g., an implementation of the power source 170) and the backside via 240 may be considered a portion of backside interconnect structures (e.g., an implementation of the interconnect structures 190) coupled to the SPRs. The semiconductor device 200A further includes a metal silicide layer 242 disposed between the backside via 240 and the source/drain structure 216/218 and a metal silicide layer 232 disposed between a frontside (or top surface) of the source/drain structure 216/218 and the source/drain contact 230.

Though not depicted, the backside via 240 may include a metal fill layer over a barrier layer. The metal fill layer may include any suitable conductive material including, for example, tungsten (W), copper (Cu), aluminum (Al), gold (Au), cobalt (Co), Ruthenium (Ru), the like, or combinations thereof. In some examples, the metal fill layer may include a seed layer. The barrier layer may include Ti, Ta, TiN, TaN, the like, or combinations thereof.

The semiconductor device 200A further includes frontside interconnect structures coupled to the source/drain contact 230. The frontside interconnect structures include, for example, vias 260 and 264 coupling the source/drain contact 230 to a frontside metallization layer ($M_0$) 270. The frontside metallization layer 270 may be a first of many metallization layers disposed over the frontside 201A of the semiconductor device 200A. The frontside metallization layer 270 may be interconnected to another frontside metallization layer by a via ($V_0$). Additional frontside metallization layers over the frontside metallization layer $M_0$ may be designated as $M_1$, $M_2$, $M_3$, $M_4$, . . . $M_n$, where adjacent frontside metallization layers are interconnected by vias $V_1$, $V_2$, $V_3$, . . . $V_{n-1}$, respectively. It is noted that, for purposes of simplicity, various dielectric (or insulating) layers within which the frontside and backside metallization layers (including the interconnect structures) are formed are omitted from the depiction of various semiconductor structures of the present disclosure. These dielectric layers may include etch-stop layers (ESLs), interlayer dielectric (ILD) layers, and intermetal dielectric (IMD) layers, to name a few.

In the present embodiments, the fuse resistor (e.g., the fuse resistor 150) of an eFuse cell (e.g., the eFuse cell 103) is disposed in the frontside metallization layer $M_2$, which is coupled to the backside metallization layer 250 through the backside via 240 and various features formed on the frontside 201A of the substrate 202, such as the source/drain structure 216/218, the source/drain contact 230, the vias 260 and 264, and the frontside metallization layer 270. Accordingly, a voltage signal can be provided from one or more backside metallization layers (e.g., the power source 170), such as the backside metallization layer 250, to components of a frontside metallization layer, such as a fuse resistor in the metallization layer $M_2$ (e.g., the fuse resistor 150), through various interconnect structures (e.g., the interconnect structures 190) including the backside via 240.

Figure 6:
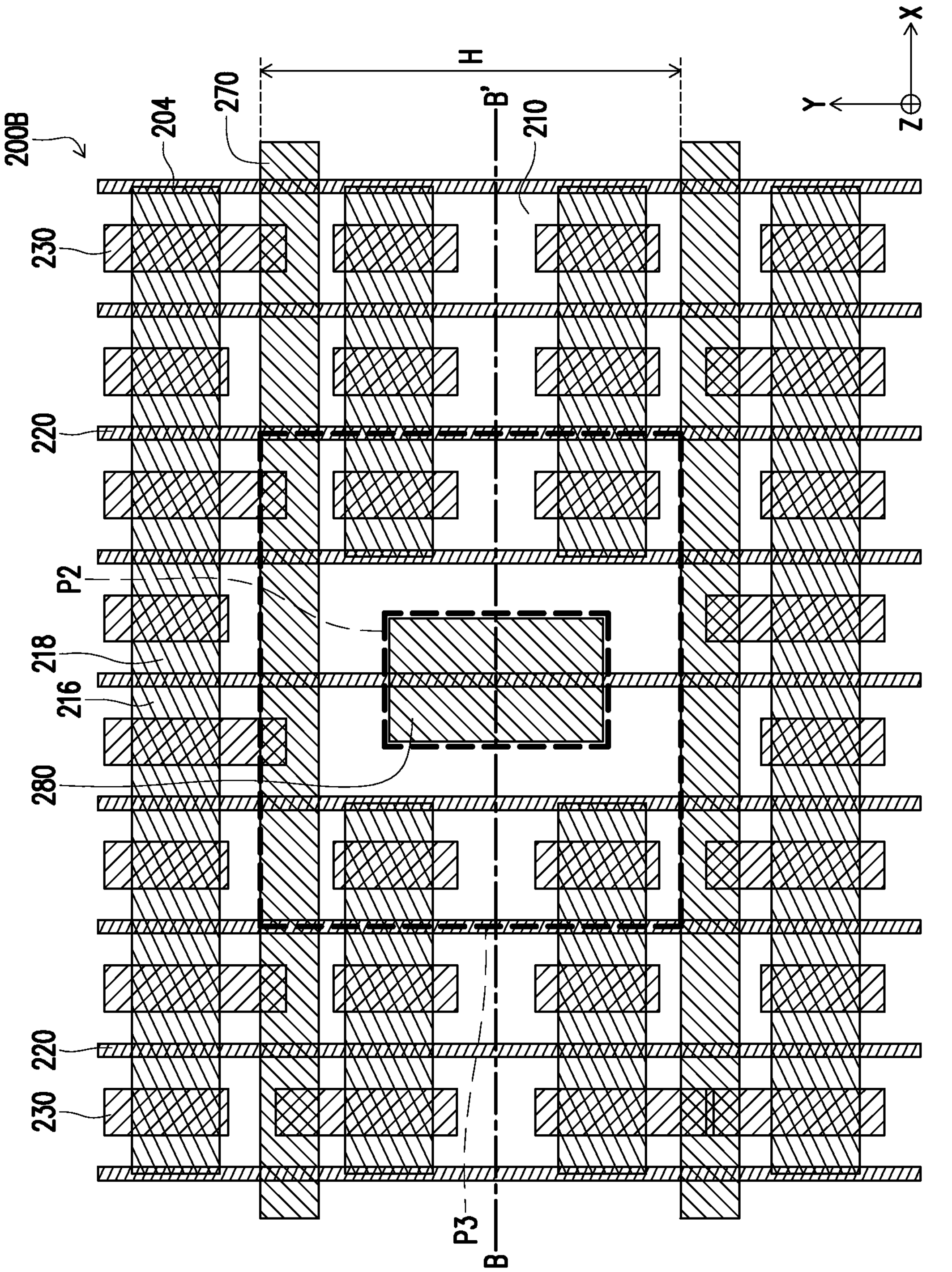
FIG. 6 illustrates a top view of a semiconductor device including a feedthrough via, in accordance with some embodiments.

FIG. 6 illustrates a top view of an example semiconductor device 200B, which is similar to the semiconductor device 200A except that the semiconductor device 200B includes a feedthrough via (FTV) 280 extending lengthwise substantially in parallel with the gate structures 220 and the source/drain contacts 230. In contrast to FIG. 4, the frontside metallization layer 270 is depicted in FIG. 6 to be over the source/drain contacts 230 and extend substantially in parallel with the active regions 204. In some embodiments, the feedthrough via 280 is disposed between portions of two adjacent gate structures 220 along a first direction (e.g., the X direction as shown) and between portions of two adjacent frontside metallization layers 270 along a second direction (e.g., the Y direction as shown).

Figure 7:
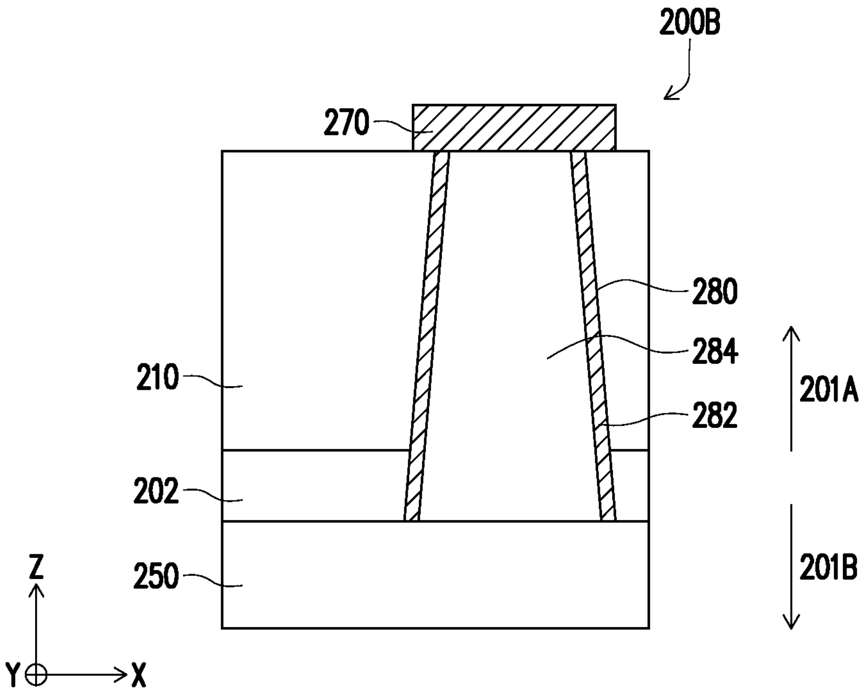
FIG. 7 illustrates a cross-sectional view of the semiconductor device taken along line BB' of FIG. 6, in accordance with some embodiments.

FIG. 7 illustrates the feedthrough via 280 in a cross-sectional view of the semiconductor device 200B along line BB' of FIG. 6. As shown, the feedthrough via 280 extends through the substrate 202 and the dielectric layer 210 to couple the backside metallization layer 250 with the frontside metallization layer 270. The feedthrough via 280 may include a metal fill layer 284 over a barrier layer 282. Compositions of the metal fill layer 284 and the barrier layer 282 may be similar to those of the metal fill layer and the barrier layer of the backside via 240 discussed above.

In existing implementations, due to the reduction in feature sizes, the backside via 240 exhibits a small cross-sectional area corresponding to the area (in top view) of the region P1 in FIG. 4. This may generally results in the backside via 240 to have a relatively high resistance, thereby limiting the current flowing to the frontside metallization layer $M_2$ (and thus the fuse resistor). In contrast, as depicted in FIG. 6, a cross-sectional area of the feedthrough via 280, represented by an area enclosed in a region P2 in FIG. 6, is greater than that of the backside via 240 as depicted in FIG. 4. As a reference, a region P3 is also depicted in FIGS. 4 and 6 and has an area (in top view) of a standard cell with a cell height H. In this regard, the feedthrough via 280 extends across a distance along the Y direction that is comparable to that of the cell height H, while the backside via 240 occupies a much smaller area in comparison.

Accordingly, the feedthrough via 280 exhibits a lower resistance than the backside via 240, provided that they are formed of the same conductive material(s). In some examples, a ratio of the resistance of the backside via 240 to the resistance of the feedthrough via 280 may be about 15:1. In this regard, using the feedthrough via 280 for supplying power from the backside 201B to the frontside 201A provides more current to a fuse resistor (e.g., the fuse resistor 150) disposed over the frontside 201A than using the backside via 240 alone, thereby making it easier to achieve the program current of the corresponding eFuse cell (e.g., the eFuse cell 103).

Furthermore, for the backside via 240, the smaller cross-sectional area improves it compatibility with other complementary MOS, or CMOS, devices, such as standard cells, as it can be more easily incorporated into existing layouts without needing substantial modification. In contrast, the larger cross-sectional area of the feedthrough via 280 may lead to modifications of existing layouts and other processing challenges, such as defects associated with gap filling (e.g., extrusion and voids) and inadvertent landing on adjacent components (e.g., cut-metal gate features).

Accordingly, the present disclosure contemplates embodiments combining features of the backside via and the feedthrough via in eFuse applications to provide interconnect structures with lower resistance that can be readily incorporated into existing layout designs of memory devices.

FIGS. 8, 10, 12, and 14 each illustrate a top view of a frontside (e.g., 301A) of example semiconductor devices 300, 400, 500, and 600, respectively, each semiconductor device having an eFuse cell 310 (e.g., an implementation of the eFuse cell 103). FIGS. 9, 11, 13, and 15 each illustrate a cross-sectional view of the semiconductor devices 300, 400, 500, and 600, respectively, along line CC' as shown in FIGS. 8, 10, 12, and 14, respectively. In the present embodiments, the line CC' extends along a lengthwise direction (e.g., the X direction as shown) of a channel (e.g., channel 314) of the access transistor (e.g., access transistor 332) of the eFuse cell 310. The semiconductor devices 300, 400, 500, and 600 may each be implemented as a portion of the semiconductor device 100. Additionally, for purposes of clarity, components (e.g., one or more interconnect structures of the BEOL and portions of the devices of the FEOL) of the semiconductor device 300 may be omitted in one or more of FIGS. 8, 10, 12, and 14. It is further noted that figures of the various frontside and backside metallization layers and the interconnections therebetween are for illustrative purposes only and therefore do not limit the present embodiments to those depicted herein. For example, more or less of the metal lines and vias may be incorporated in the semiconductor devices 300, 400, 500, and 600 and some components may be omitted according to some embodiments.

Figure 8:
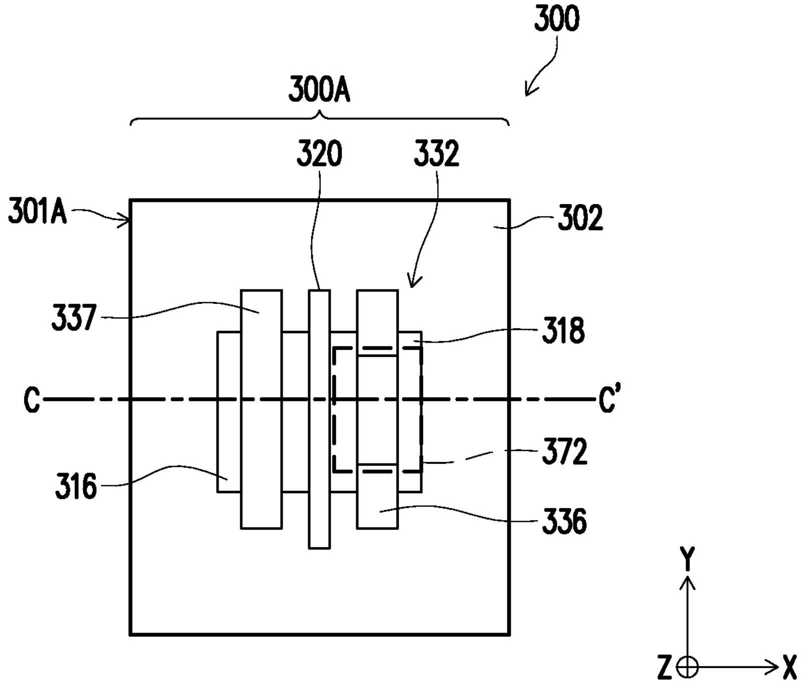
FIGS. 8, 10, 12, and 14 each illustrate a top view of a frontside of a semiconductor device including an eFuse cell coupled to backside power rails, in accordance with some embodiments.
Figure 9:
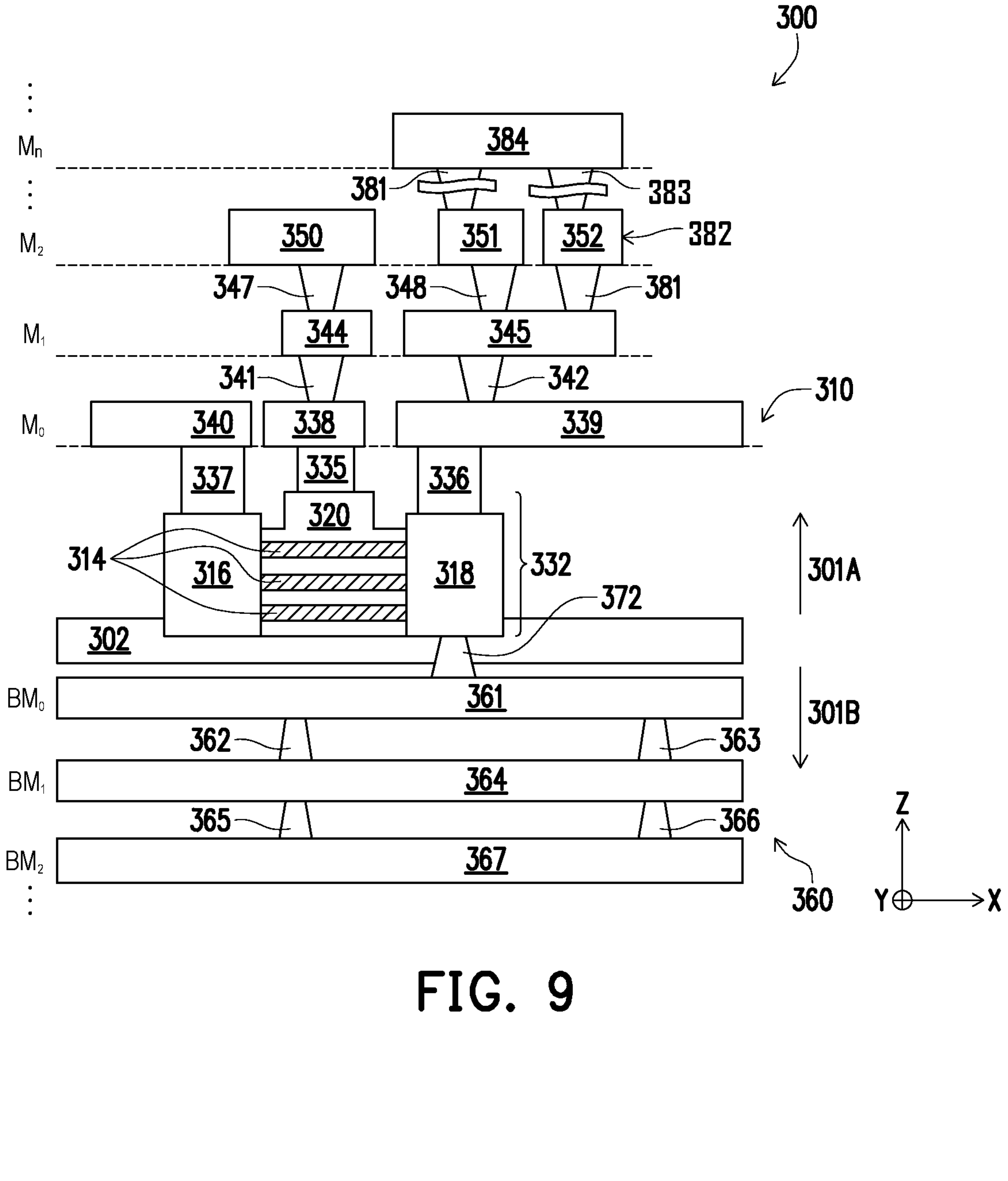
FIGS. 9, 11, 13, and 15 each illustrate a cross-sectional view of the semiconductor device along line CC' of FIGS. 8, 10, 12, and 14, respectively, in accordance with some embodiments.

Referring to FIGS. 8 and 9, the eFuse cell 310 in the semiconductor device 300 includes a fuse resistor 333 (e.g., an implementation of the fuse resistor 150) and the access transistor 332 (e.g., an implementation of the access transistor 160) connected to each other in series and formed on a frontside 301A of a substrate (or semiconductor substrate) 302 (e.g., an implementation of the substrate 202). The access transistor 332 may be implemented as a gate-all-around (GAA) field-effect-transistor (FET) device, in some embodiments. However, it should be understood that the access transistor 332 can be implemented as any of various other types of transistor structures, while remaining within the scope of the present disclosure. FIGS. 8-15 are simplified to illustrate relative spatial configurations of the respective semiconductor devices, and thus, it should be understood that one or more features/structures of a completed GAA FET device may not be displayed for clarity purposes.

On the frontside 301A, the semiconductor device 300 includes an active region (not labeled separately) over the substrate 302 having portions being formed as a channel 314, and portions being formed as source/drain structures 316 and 318 (e.g., implementations of the source/drain structures 216 and 218). The channel 314 includes one or more nanostructures (e.g., nanosheets, nanowires) vertically spaced apart from each other. The semiconductor device 300 includes a (e.g., metal) gate structure 320 wrapping around the nanostructures of the channel 314. As such, the gate structure 320 engages with the channel 314, which is connected to the source/drain structures 316 and 318 to form the access transistor (e.g., a GAA FET) 332.

Over the access transistor 332 on the frontside 301A, a number of MEOL interconnect (e.g., metal) structures can be formed, and each of the MEOL interconnect structures can provide an electrical connection path for a corresponding gate structure or a source/drain structure. For example, the semiconductor device 300 includes MEOL interconnect structures 335, 336, and 337. The MEOL interconnect structure 335 is formed as a via structure (alternatively referred to as a VG) in electrical contact with the gate structure 320, and the MEOL interconnect structures 336 and 337 are source/drain contacts (e.g., implementations of the source/drain contacts 230; alternatively referred to as MDs) in electrical contact with the source/drain structures 318 and 316, respectively.

Over the MEOL interconnect structures (e.g., VG, MD), the semiconductor device 300 includes a number of frontside metallization layers. Each of the frontside metallization layers includes a number of BEOL interconnect structures, such as metal (or conductive) lines and via structures, embedded in a corresponding dielectric material (e.g., an ILD layer, an IMD layer, an ESL, etc.). For example, the semiconductor device 300 includes frontside metallization layers, $M_0$, $M_1$, $M_2$ . . . , and $M_n$. Although four frontside metallization layers are shown, it should be understood that the semiconductor device 300 can include any number of frontside metallization layers while remaining within the scope of the present disclosure.

The frontside metallization layer $M_0$ (e.g., an implementations of the frontside metallization layer 270) includes metal lines 338, 339, and 340 (alternatively referred to as $M_0$ tracks), and via structures 341 and 342 (alternatively sometimes referred to as $V_0$); the frontside metallization layer $M_1$ includes metal lines 344 and 345 (alternatively referred to as $M_1$ tracks), and via structures 347 and 348 (alternatively referred to as $V_1$); and the frontside metallization layer $M_2$ includes metal lines 350, 351, and 352 (alternatively referred to as $M_2$ tracks). In the present embodiments, the $M_2$ track 352 operatively serves as the fuse resistor 333 of the eFuse cell 310. The VG 335 can allow the gate structure 320 to be coupled to or in electrical contact with the $M_2$ track 350 through the $M_0$ track 338, $V_0$ 341, $M_1$ track 344, and $V_1$ 347; the MD 336 can allow the source/drain structure 318 to be coupled to the $M_2$ track 351 through the $M_0$ track 339, $V_0$ 342, $M_1$ track 345, and $V_1$ 348; and the MD 337 couples the source/drain structure 316 to the $M_0$ track 340.

The semiconductor device 300 further includes additional frontside metallization layers over the frontside metallization layer $M_2$. For example, the frontside metallization layer $M_n$ is formed over the frontside metallization layer $M_2$, where n is an integer greater than 2, such as 3, 4, or 5. The frontside metallization layer $M_n$ is in electrical contact with the frontside metallization layer $M_2$ through one or more intervening metallization layers each including metal lines or tracks coupled to corresponding via structures. In the depicted embodiment, the frontside metallization layer $M_n$ includes a metal line 384 (alternatively referred to as a $M_n$ track) and via structures 381 and 383 (alternatively referred to as $V_{n-1}$), which form electrical contact between the $M_n$ track 384 and the $M_2$ tracks 351 and 352 of the frontside metallization layer $M_2$, respectively.

On the backside 301B, the semiconductor device 300 includes a number of backside metallization layers. Each of the backside metallization layers includes a number of BEOL interconnect structures, metal (or conductive) lines and via structures, embedded in a corresponding dielectric material (e.g., e.g., an ILD layer, an IMD layer, an ESL, etc.). For example, the semiconductor device 300 includes backside metallization layers, $BM_0$, $BM_1$, and $BM_2$. Although three backside metallization layers are shown, it should be understood that the semiconductor device 300 can include any number of backside metallization layers while remaining within the scope of the present disclosure.

The backside metallization layer $BM_0$ includes a metal line 361 (alternatively referred to as a $BM_0$ track), and via structures 362 and 363 (alternatively referred to as $BV_0$s); the backside metallization layer $BM_1$ includes metal line 364 (alternatively referred to as $BM_1$ tracks), and via structures 365 and 366 (alternatively referred to as $BV_1$s); and the backside metallization layer $BM_2$ includes a metal line 367 (alternatively referred to as a $BM_2$ track).

In the example of FIG. 9, at least some of the metal lines and via structures formed across the backside metallization layers collectively serve as SPRs 360 (e.g., collectively an implementation of the power source 170). In various embodiments, the SPRs 360 are coupled to the frontside features (e.g., the eFuse cell 310) through various backside interconnect structures (e.g., an implementation of the interconnect structures 190). In the present embodiments, as shown in FIG. 9, the SPRs 360 are coupled to one of the source/drain structures 316 and 318 through a backside via 372 (e.g., an implementation of the backside via 240) to provide power (e.g., a voltage/current signal) to components over the frontside 301A, including the eFuse cell 310 (e.g., the fuse resistor 333). The backside via 372 couples the SPRs 360 to the source/drain structure 318, which is then coupled to the frontside metallization layers thereover through various frontside MEOL and BEOL interconnect structures. For example, the backside via 372 couples the BM0 track 361 to the source/drain structure 318, which is then coupled to the M0 track 339 through the MD 336. The M0 track 339 is further coupled to the fuse resistor 333 (such as the M2 track 352) through intervening tracks and via structures of the frontside metallization layers, including the V0 342, the M1 track 345, and the V1 382, for example. In some embodiments, the backside via 372 couples the SPRs 360 to the source/drain structure 316 instead and subsequently to the frontside metallization layers thereover. In some embodiments, the current may be supplied from the BM0 track 361 to a higher level metallization layer (e.g., the Mn track 384) first and then to the M2 track 352 through the Vn−1 383.

When a voltage ($V_{total}$) is applied on the SPRs 360, a total current ($I_{total\_1}$) corresponding to a total resistance ($R_{total\_1}$) of the interconnect structures between the SPRs 360 and the frontside metallization layer $M_2$, which includes the backside via 372, flows to the fuse resistor 333. In the present embodiments, the $R_{total\_1}$ is approximated by the resistance of the backside via 372 ($R_{372}$) and the $I_{total\_1}$ can be approximated by $V_{total}/R_{total\_1}$, which is the current ($I_{372}$) flowing through the backside via 372. If such current $I_{total\_1}$ exceeds the program current of the eFuse cell 310, the fuse resistor 333 would be blown or burned out, changing the behavior of the semiconductor device 300. In this regard, maintaining a low $R_{372}$ ensures that a high level of current $I_{total\_1}$ can be provided to the fuse resistor 333 to meet the program current of the eFuse cell 310. As discussed above with respect to the backside via 240 and the feedthrough via 280, the resistance of an interconnect structure (e.g., vias) generally increases as the cross-sectional area of the feature decreases. Accordingly, the present disclosure contemplates methods of lowering the resistance in the interconnect structures between the SPRs 360 and the fuse resistor 333 to ensure proper function of the eFuse cell 310.

Figure 12:
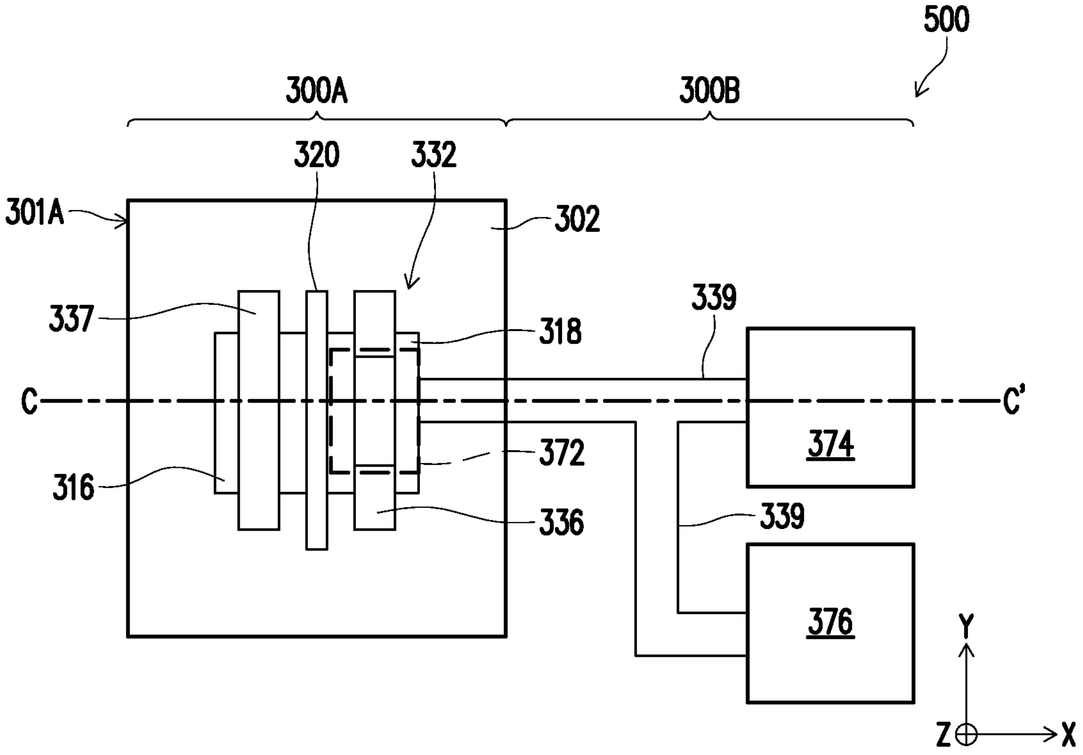
Figure 13:
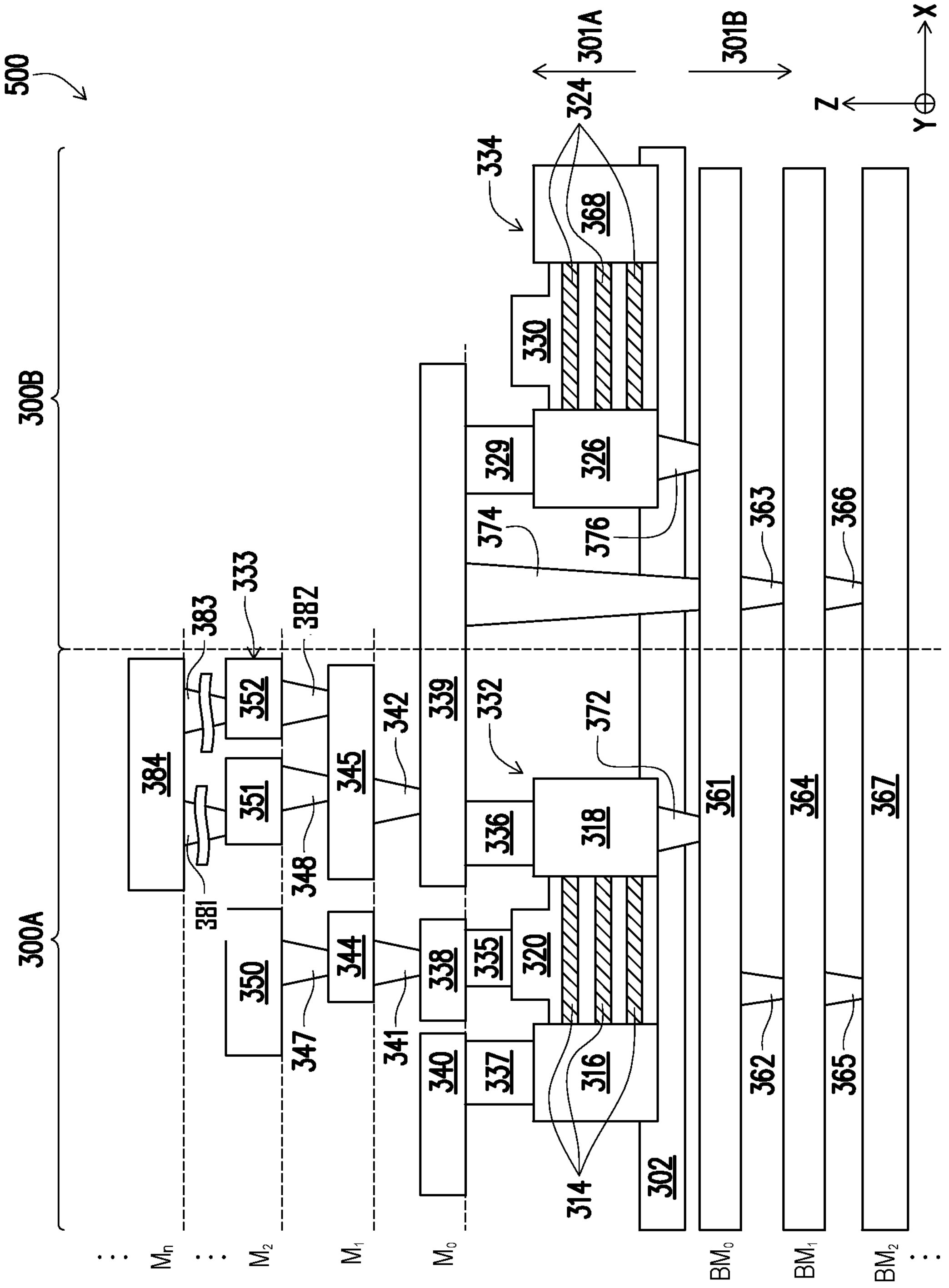
Figure 14:
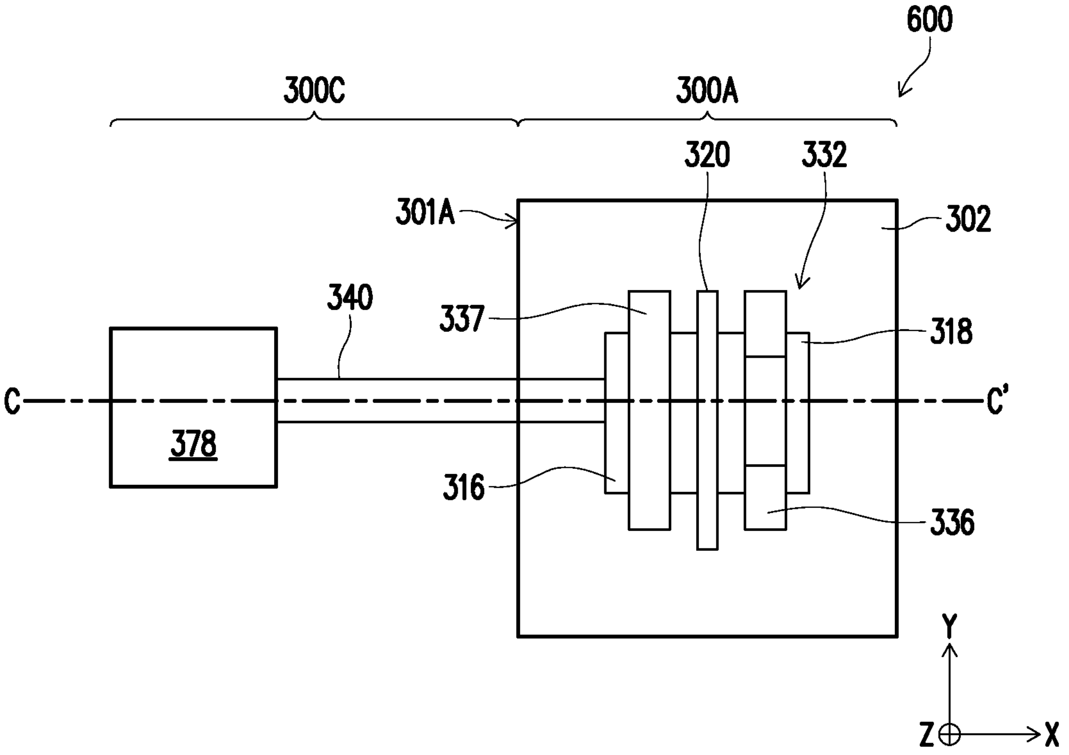
Figure 15:
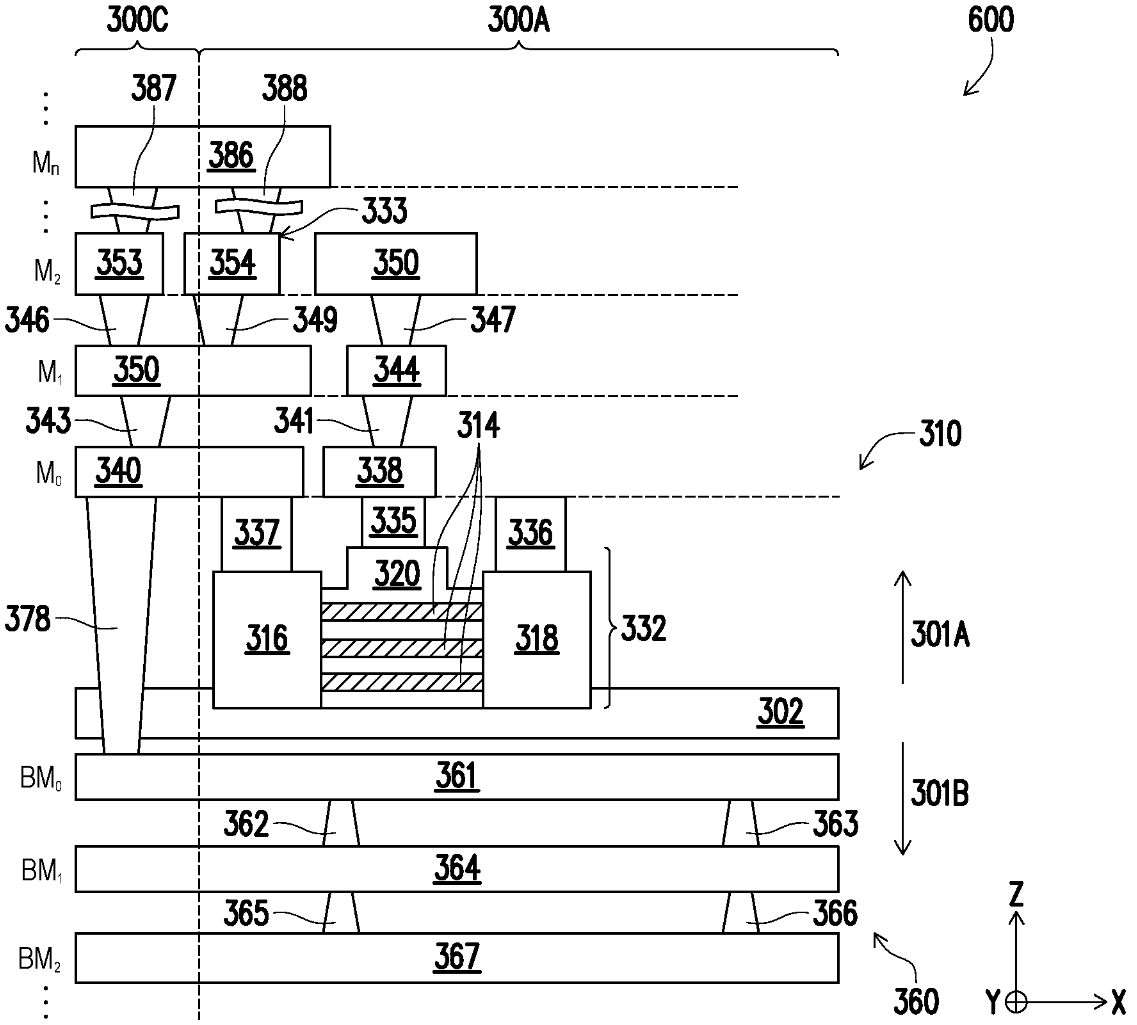

Referring to FIGS. 10-15, various embodiments of the interconnect structures configured to provide current from the backside 301B to the frontside 301A in response to an applied voltage are illustrated. As shown, the semiconductor devices 400 and 500 each include a functional device region 300A and a dummy device region 300B (FIGS. 10-13), and the semiconductor device 600 includes the functional device region 300A and a dummy device region 300C (FIGS. 14 and 15). In the present embodiments, the functional device region 300A provides devices that comprise various functional circuits, such as those of the semiconductor device 100, while the dummy device regions 300B and 300C are configured to facilitate the operation of the functional circuits as discussed in detail below. In some examples, the dummy device regions 300B and 300C provide dummy devices that may serve additional purposes, such as being adopted for re-connections during a re-design process and providing pattern structures for process control in common analog design. As provided herein, the eFuse cell 310 is provided in the functional device region 300A. It is noted that the present embodiments are for illustration purposes only and do not limit the specific arrangement or sizes of the device regions to those depicted herein. For example, the present disclosure is not limited to embodiments in which the dummy device regions 300B and 300C are each disposed immediately adjacent to the functional device region 300A as depicted herein.

Figure 10:
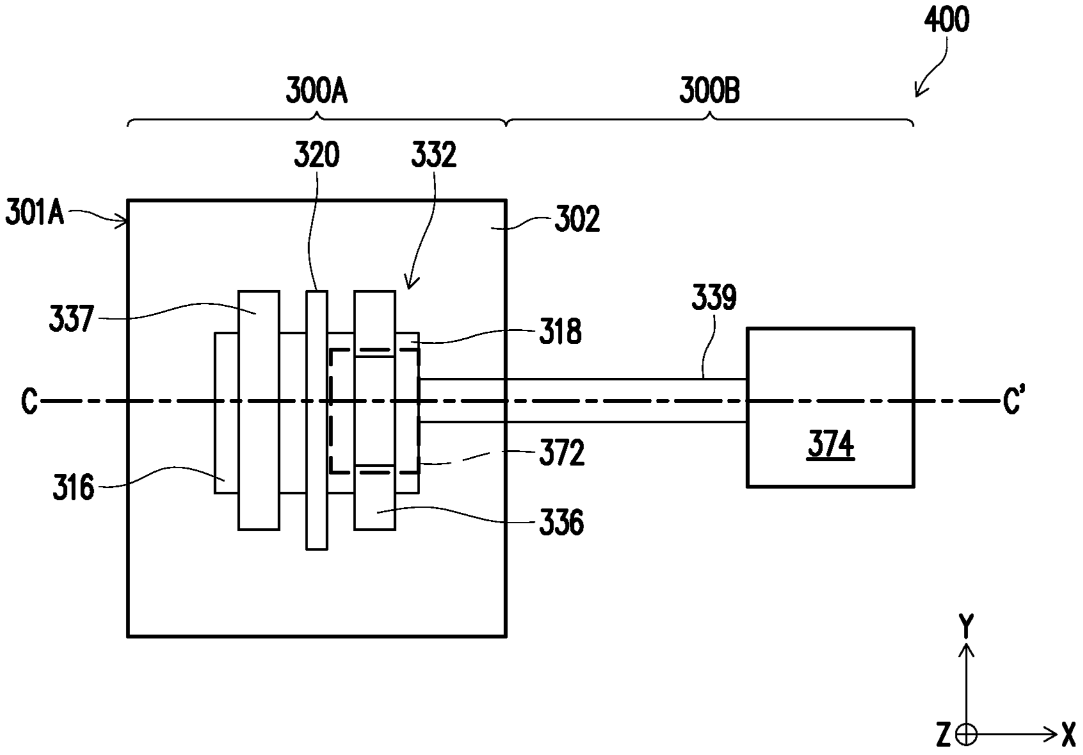
Figure 11:
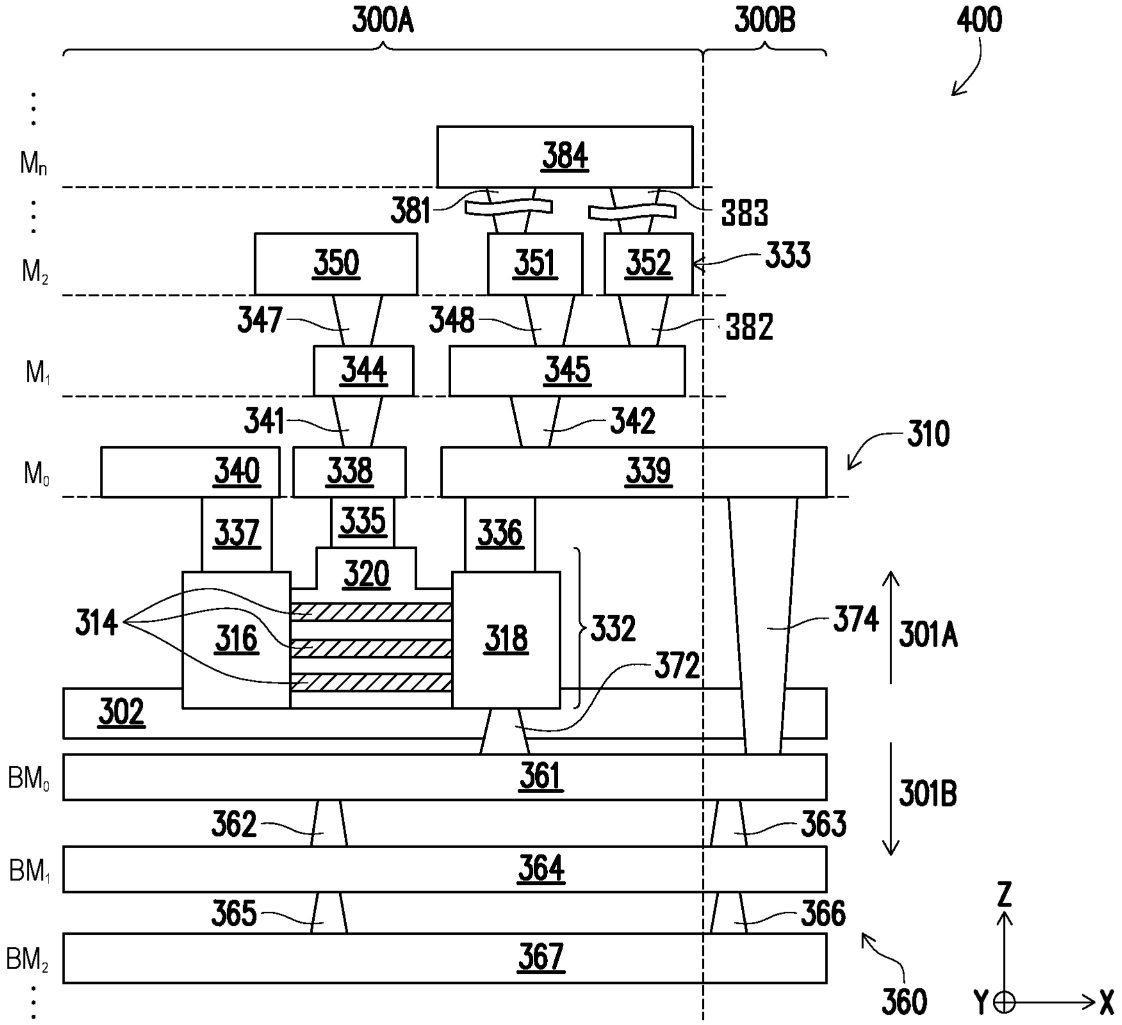

FIGS. 10 and 11 collectively illustrate a semiconductor device 400 according to some embodiments of the present disclosure. The semiconductor device 400 has a structure that is similar to that of the semiconductor device 300. For example, the semiconductor device 400 includes the eFuse cell 310 disposed in the functional device region 300A and powered by the SPRs 360, where the SPRs 360 are coupled to the fuse resistor 333 (as the $M_2$ track 352) of the eFuse cell 310 by at least the backside via 372. However, the semiconductor device 400 differs from the semiconductor device 300 in that it includes a feedthrough via 374 (e.g., an implementation of the feedthrough via 280) disposed in the dummy device region 300B and configured to couple the SPRs 360 (e.g., the backside metallization layer $BM_0$) to the frontside metallization layers (e.g., the $M_0$ track 339 and subsequently the $M_2$ track 352, or the fuse resistor 333), where the feedthrough via 374 is coupled in parallel with the backside via 372. In this regard, the semiconductor device 400 may be referred to as having a hybrid interconnect structure for providing power from the SPRs to the fuse resistor 333. In some embodiments, the feedthrough via 374 directly (i.e., without intervening interconnect structures) extends through the substrate 302 and any dielectric layers disposed thereover (e.g., the dielectric layer 210) to couple the $BM_0$ track 361 to the $M_0$ track 339.

Similar to the discussion above with respect to the semiconductor devices 200A and 200B, the feedthrough via 374 has a resistance ($R_{374}$) that is lower than a resistance ($R_{372}$) of the backside via 372, i.e., $R_{374}<R_{372}$, due to their difference in cross-sectional area. In this regard, since the backside via 372 and the feedthrough via 374 are connected in parallel and to the same backside metallization layer (e.g., the $BM_0$ track 361), the voltage V applied to the backside metallization layer results in a higher current ($I_{374}$) flowing through the feedthrough via 374 than the current ($I_{372}$) flowing through the backside via 372. Based on principles of parallel circuits, a total resistance $R_{total\_2}$ of a parallel circuit is reduced when more components are added to the parallel circuit. Accordingly, in response to the applied voltage V, a total current $I_{total\_2}$ provided to the fuse resistor 333, which is a sum of at least the current through the individual components connected in parallel, i.e., $I_{total\_2}=I_{372}+I_{374}$, is increased when the feedthrough via 374 is coupled in parallel to the backside via 372. In other words, $I_{total\_2}$ is greater than $I_{total\_1}$. Furthermore, as the feedthrough via 374 is disposed in the dummy device region 300B, circuit layouts within the functional device region 300A remains unaffected by the placement of the feedthrough via 374, thereby reducing or avoiding any processing complexity.

FIGS. 12 and 13 collectively illustrate a semiconductor device 500 according to some embodiments of the present disclosure. The semiconductor device 500 has a structure that is similar to that of the semiconductor device 300. For example, the semiconductor device 500 includes the eFuse cell 310 disposed in the functional device region 300A and powered by the SPRs 360, where the SPRs 360 are coupled to the fuse resistor 333 (as the M2 track 352) of the eFuse cell 310 by at least the backside via 372. However, the semiconductor device 500 differs from the semiconductor device 300 in that it includes the feedthrough via 374, a transistor 334, and a backside via 376 disposed in the dummy device region 300B, where the backside via 372, the feedthrough via 374, and the backside via 376 are connected in parallel and collectively couple the SPRs 360 (e.g., the backside metallization layer BM0) to the frontside metallization layers (e.g., the M0 track 339).

On the frontside 301A and in the dummy device region 300B, the semiconductor device 500 includes an active region (not labeled separately) over the substrate 302 having portions being formed as a channel 324, and portions being formed as source/drain structures 326 and 328 (e.g., implementations of the source/drain structures 216 and 218). The channel 324, and the source/drain structures 326 and 328 may be similar to the channel 314 and the source/drain structures 316 and 318 of the access transistor 332, respectively. The semiconductor device 500 further includes a (e.g., metal) gate structure 330, which is similar to the gate structure 320 of the access transistor 332, wrapping around the nanostructures of the channel 324. As such, the gate structure 330 engages with the channel 324, which is connected to the source/drain structures 326 and 328, to form the transistor 334. In some embodiments, the transistor 334 is implemented as a GAA FET device.

Over the transistor 334 on the frontside 301A and in the dummy device region 300B, the semiconductor device 500 includes a number of MEOL interconnect (e.g., metal) structures similar to those of the semiconductor device 300. For example, the semiconductor device 500 includes MEOL interconnect structure 329 (alternatively referred to as a MD), which is similar to the MEOL interconnect structures 336 and 337, configured as a source/drain contact in electrical contact with the source/drain structure 326. Additional MEOL interconnect structures may be formed in electrical connection with other components of the transistor 334.

The semiconductor device 500 further includes a number of frontside and backside metallization layers similar to those of the semiconductor device 300. In some embodiments, portions of one or more of the frontside metallization layers $M_0$ to $M_n$ and the backside metallization layers $BM_0$ to $BM_2$ disposed in the functional device region 300A extend laterally (e.g., along the X direction) to the dummy device region 300B. For example, the $M_0$ track 339, which is coupled to the $BM_0$ track 361 through the MD 336, the source/drain structure 318, and the backside via 372 in the functional device region 300A, extends laterally to the dummy device region 300B. Though not depicted, the additional frontside metallization layers $M_1$ to $M_n$ may be formed over the $M_0$ track 339 on the frontside 301A and the additional backside metallization layers may be formed over the backside metallization layer $BM_2$ in the dummy device region 300B.

As shown in FIG. 13, the $M_0$ track 339 is directly coupled to the $BM_0$ track 361 through the feedthrough via 374, which is coupled to the backside via 372 in parallel as discussed in detail above with respect to the semiconductor device 400. Furthermore, the backside via 376 is also coupled to the backside via 372 in parallel in a manner similar to the parallel connection between the backside via 372 and the feedthrough via 374. In the depicted embodiment, the backside via 376 extends through the substrate 302 to couple the $BM_0$ track 361 to the source/drain structure 326 and further to the $M_0$ track 339 through the MD 329. In some embodiments, the backside via 376 couples the SPRs 360 to the source/drain structure 328 instead and subsequently to a $M_0$ track. Accordingly, the backside via 372, the feedthrough via 374, and the backside via 376 are connected in parallel and couple the SPRs 360 to the $M_0$ track 339, which is subsequently coupled to the fuse resistor 333 (as the $M_2$ track 352) of the eFuse cell 310 on the frontside 301A.

Similar to the discussion above, a total resistance $R_{total\_3}$ of the parallel circuit is further reduced by the coupling of the backside via 376. Therefore, in response to the applied voltage V, the total current $I_{total\_3}$ flowing from the SPRs 360 to the fuse resistor 333, which is the sum of at least the current flowing through each of the backside via 372 ($I_{372}$), the feedthrough via 374 ($I_{374}$), and the backside via 376 ($I_{376}$), i.e., $I_{total\_3}=I_{372}+I_{374}+I_{376}$, is increased due to the coupling of the backside via 376 in parallel to the backside via 372 and the feedthrough via 374. In other words, $I_{total\_3}$ is greater than $I_{total\_2}$.

FIGS. 14 and 15 collectively illustrate a semiconductor device 600 according to some embodiments of the present disclosure. The semiconductor device 600 has a structure that is similar to that of the semiconductor device 300. For example, the semiconductor device 600 includes the eFuse cell 310 disposed in the functional device region 300A and powered by the SPRs 360. However, the semiconductor device 600 differs from the semiconductor device 300 in that it includes a feedthrough via 378 (e.g., an implementation of the feedthrough via 280) disposed in the dummy device region 300C and configured to couple the SPRs 360 (e.g., the backside metallization layer $BM_0$) with a $M_2$ track 354, which operatively serves as the fuse resistor 333. Instead of utilizing the backside via 372 coupled to the source/drain structure 318 to provide the current from the SPRs 360 to the fuse resistor 333, as in the case for the semiconductor devices 300, 400, and 500, the semiconductor device 600 relies on the feedthrough via 378 to provide the current to the fuse resistor 333 as depicted in FIG. 15. Specifically, the feedthrough via 378 directly couples the $BM_0$ track 361 to the $M_0$ track 340, which is further coupled to the fuse resistor 333 implemented in the frontside metallization layer $M_2$.

The semiconductor device 600 further includes a number of frontside and backside metallization layers similar to those of the semiconductor device 300. In some embodiments, portions of one or more of the frontside metallization layers $M_0$ to $M_n$ and the backside metallization layers $BM_0$ to $BM_2$ disposed in the functional device region 300A extend laterally (e.g., along the X direction) to the dummy device region 300C. For example, the $M_0$ track 340, which is coupled to the source/drain structure 316 through the MD 337 in the functional device region 300A, extends laterally to the dummy device region 300C to couple to the feedthrough via 378, which is further coupled to the $BM_0$ track 361.

Referring to FIG. 15, the feedthrough via 378 allows the BM0 track 361 to be coupled to M2 tracks 353 and 354 through the substrate 302, the M0 track 340, V0 343, M1 track 350, and V1 346 and 349, respectively, where the M2 track 354 operatively serves as the fuse resistor 333. In some embodiments, power may be supplied from the M2 track 353 to a higher level metallization layer (e.g., a Mn track 386) through Vn−1 387 and then provided to the M2 track 354 through Vn−1 388. In this regard, the feedthrough via 378 provides an alternative means to the backside via 372 of the semiconductor device 300, for example, for providing power to the fuse resistor 333 (as the M2 track 354) from the SPRs 360. In this regard, the feedthrough via 378 may be implemented an alternative interconnect structure to the backside via 372 and thus can be coupled to another backside via formed in the dummy device region 300C similar to the coupling of the feedthrough via 374 to the backside via 376 as depicted in FIGS. 12 and 13.

Figure 16:
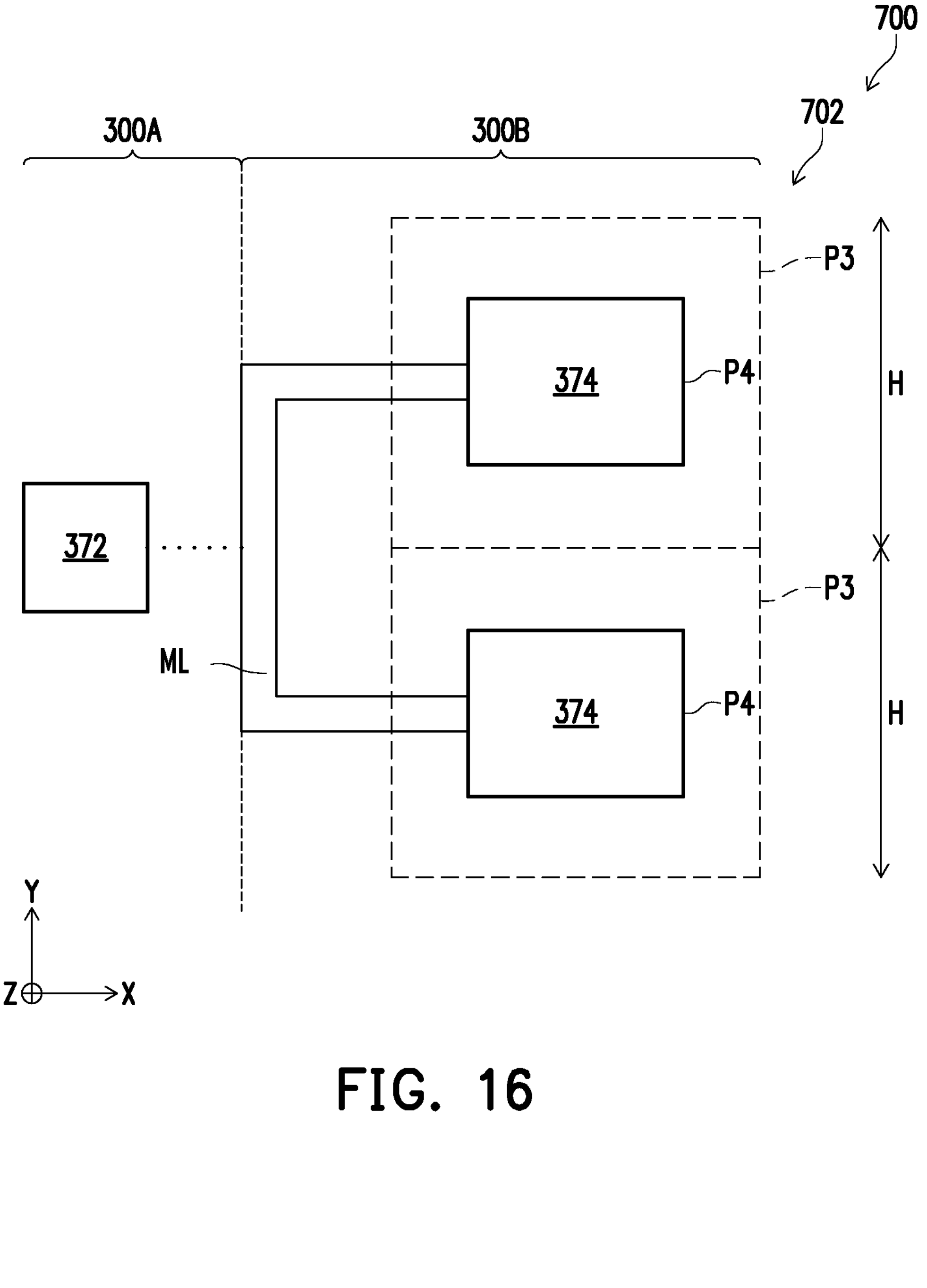
FIGS. 16, 17, and 18 each illustrate a schematic top view of a portion of a semiconductor device including an interconnect structure coupling backside power rails to an eFuse cell, in accordance with some embodiments.
Figure 17:
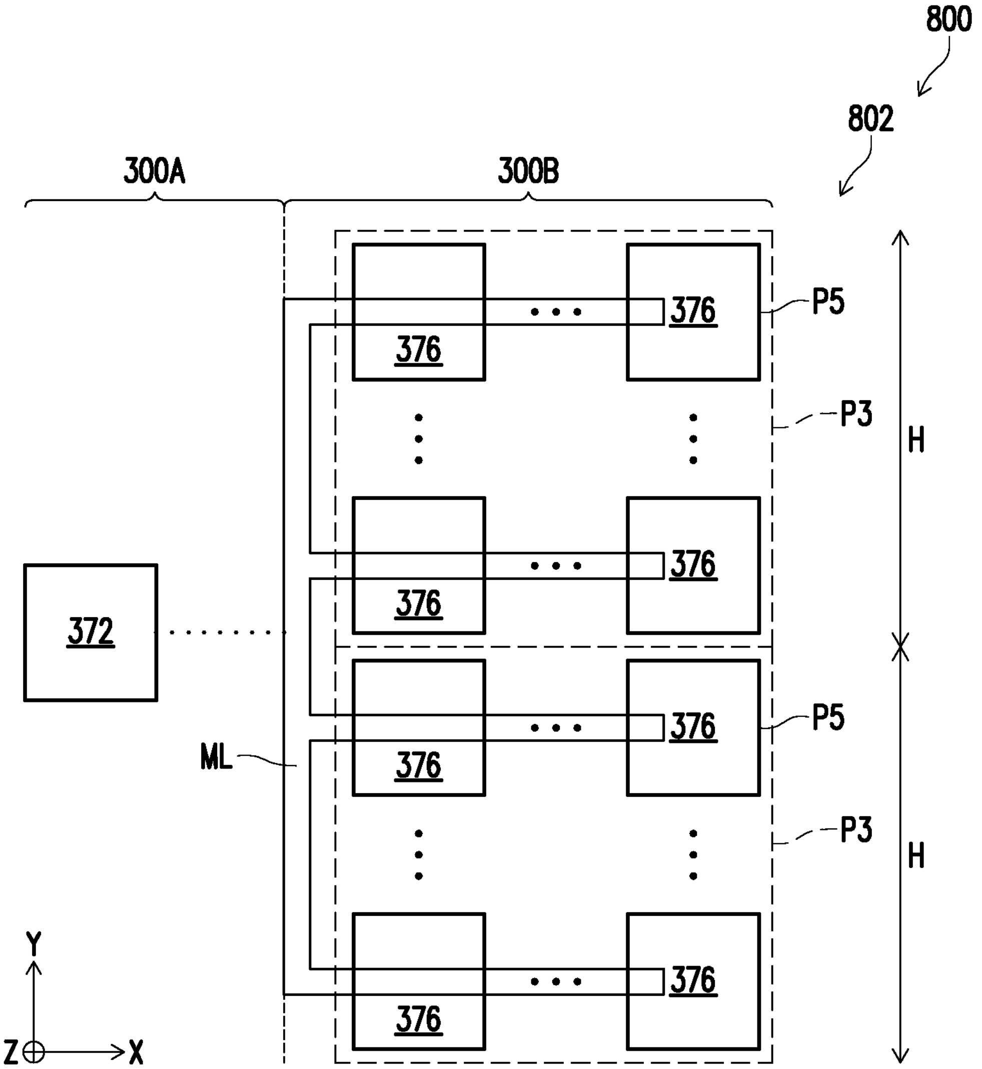
Figure 18:
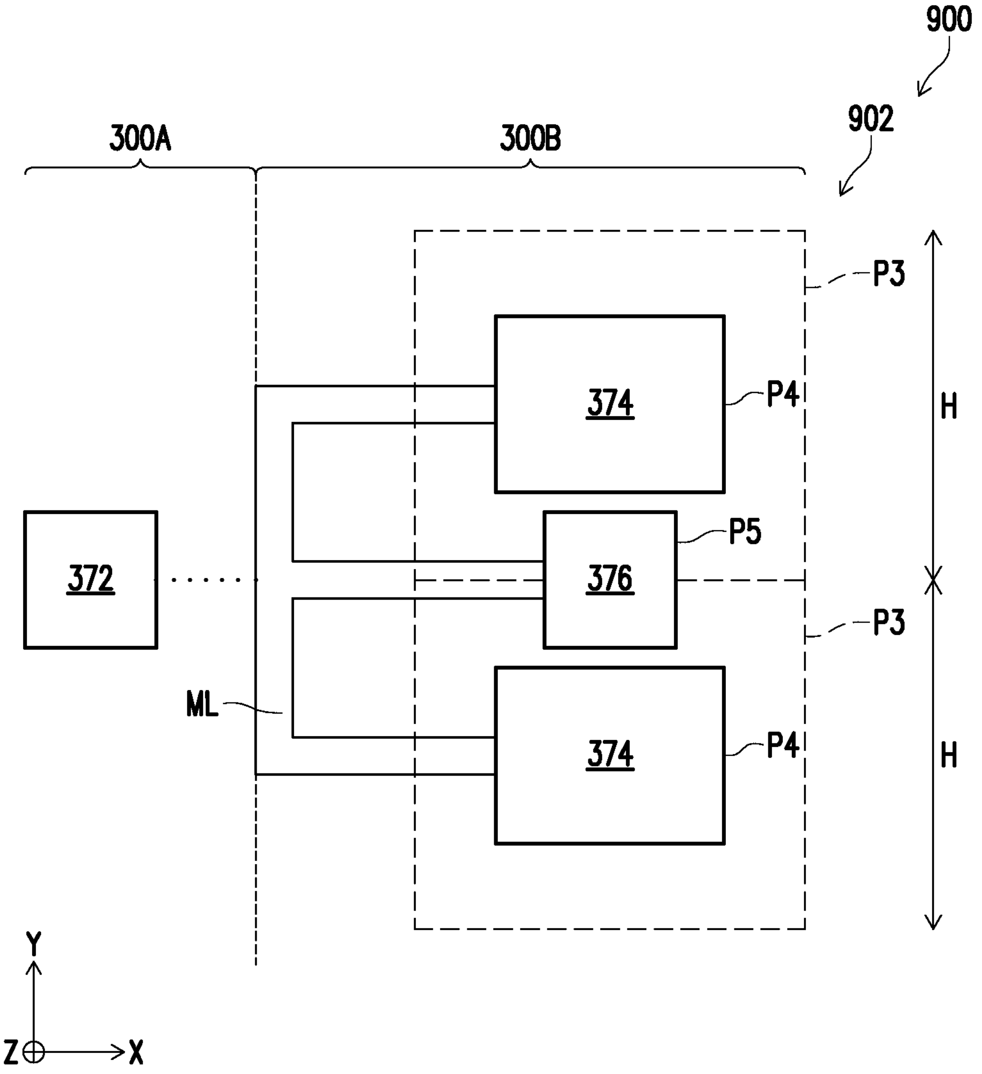

In some examples, referring to FIGS. 16-18 collectively, depending upon the program current of the eFuse cell 310 and available area in the layout design, additional feedthrough via(s), similar to the feedthrough via 374, and additional backside via(s), similar to the backside via 376, may be coupled in parallel to the backside via 372, which are in electrical connection with the source/drain structure 318 of the access transistor 332. FIGS. 16-18 each depict a portion of a semiconductor device similar to those provided herein in a schematic top view to illustrate the relative spatial arrangement of the vias. In this regard, for purposes of clarity, some components of the semiconductor device may be omitted. It is noted that components of one or more of the semiconductor devices 300, 400, and 500 may be referred to in FIGS. 16-18 using the same reference numerals as those provided above. It is further noted that coupling schemes 700, 800, and 900 depicted in FIGS. 16-18, respectively, may be implemented alone or in suitable combinations in any of the semiconductor devices 300, 400, and 500.

FIG. 16 illustrates the coupling scheme 700 of interconnect structures that can be applied between the SPRs 360 and the fuse resistor 333. The coupling scheme 700 includes two feedthrough vias 374 disposed in the dummy device region 300B, and the backside via 372 disposed in the functional device region 300A, where the two feedthrough vias 374 and the backside via 372 are coupled in parallel (similar to the embodiment depicted in FIGS. 10 and 11) to form an interconnect structure 702. In the depicted embodiments, the vias are coupled by a metallization layer ML, which may be a frontside metallization layer (e.g., a $M_0$ track) or a backside metallization layer (e.g., a $BM_0$ track), depending on specific connections utilized. As discussed in detail above with respect to the semiconductor device 200B, each feedthrough via 374 has a cross-sectional area corresponding to an area of a region P4, which is comparable in size to that occupied by a standard cell. In depicted embodiment, the area occupied by a standard cell is represented by an area of the region P3 with the cell height H. In some examples, additional feedthrough vias similar to the feedthrough via 374 may be coupled in parallel to the interconnect structure 702.

FIG. 17 illustrates the coupling scheme 800 that includes a plurality of the backside vias 376 disposed in the dummy device region 300B and coupled to each other in parallel and further coupled to the backside via 372 in the functional device region 300A in parallel to form an interconnect structure 802. The vias may be coupled by the metallization layer ML. Region P5 has an area corresponding to a cross-sectional area of the backside via 376, which is smaller than the area of the region P3 as shown. As such, for a given area (e.g., an area of a standard cell) provided in the dummy device region 300B, many more backside vias 376 than the feedthrough via 374 can be formed for coupling, thereby providing an optional for reducing a total resistance of the interconnect structures when the available area in the layout designs of the semiconductor device is limited. In some examples, additional backside vias similar to the backside via 376 may be coupled in parallel to the interconnect structure 802.

The coupling scheme 900 illustrated in FIG. 18 includes two feedthrough vias 374 and one backside via 376 disposed in the dummy device region 300B and the backside via 372 disposed in the functional device region 300A, where the feedthrough vias 374, the backside via 376, and the backside via 372 are coupled in parallel (similar to the embodiment depicted in FIGS. 12 and 13) to form an interconnect structure 902 between the SPRs 360 and the fuse resistor 333. As shown, its smaller cross-sectional area allows the backside via 376 to be more easily incorporated into existing layout designs (e.g., in available areas between adjacent feedthrough vias 374), thereby improving its compatibility with a variety of circuits.

Referring to FIGS. 16-18 collectively, coupling one or more of each of the feedthrough via 374 and the backside via 376 with the backside via 372 in parallel reduces the $R_{total}$ of the interconnect structures (e.g., the interconnect structures 702, 802, and 902), which increases the $I_{total}$ flowing through the interconnect structures in response to a voltage applied at the SPRs 360. In some examples, additional feedthrough vias similar to the feedthrough via 374 and additional backside vias similar to the backside via 376 may be coupled in parallel to the interconnect structure 902. In some examples, the number of the feedthrough vias and the number of the backside vias in the hybrid interconnect structure may be determined based on factors such as the program current of the fuse resistor 333 and the amount of area available in the existing layout design. In some examples, one or more of the interconnect structures 702, 802, and 902 may be coupled to circuits integrated within the semiconductor device 100 to increase current provided from a backside power source (e.g., SPRs) to frontside components (e.g., a fuse resistor) of an eFuse cell to enhance tuning of the circuits within the semiconductor device 100.

Figure 19:
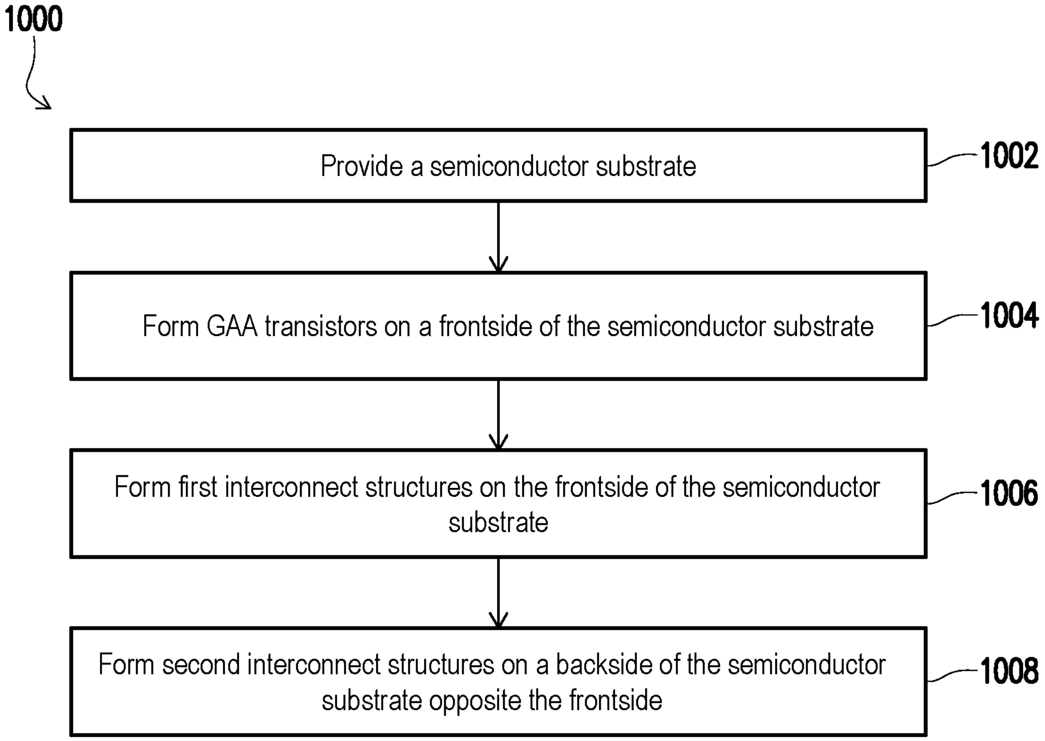
FIG. 19 illustrates a flow chart of a method for fabricating a semiconductor device including an eFuse cell coupled to backside power rails, in accordance with some embodiments

FIG. 19 is a flowchart illustrating an example method 1000 for fabricating a semiconductor device (e.g., the semiconductor device 300, 400, 500, or 600) that includes the eFuse cell (e.g., the eFuse cell 310), according to various aspects of the present disclosure.

At least some operations of the method 1000 can be used to form a semiconductor device in a non-planar transistor configuration. For example, the semiconductor device may include one or more GAA FET devices. However, it should be understood that the transistors of the semiconductor device may be each configured in any of various other types of transistors such as, for example, a CFET, while remaining within the scope of the present disclosure. It should be noted that the method 1000 is merely an example, and is not intended to limit the present disclosure. Accordingly, it should be understood that additional operations may be provided before, during, and/or after the method 1000, and that some other operations may only be briefly described herein. The following discussions of the method 1000 may refer to one or more components of FIGS. 1-18.

In brief overview, the method 1000 starts with operation 1002 of providing a substrate (e.g., the substrate 302). The method 1000 proceeds to operation 1004 of forming a number of GAA FET devices (e.g., the access transistor 332 in the functional device region 300A and the transistor 334 in the dummy device region 300B) on a frontside (e.g., the frontside 301A) of the substrate. The method 1000 proceeds to operation 1006 of forming a number of first metallization layers and first interconnect structures (e.g., the MDs, the VG, the $V_0$-$V_{n-1}$, and the tracks of $M_0$-$M_n$) on the frontside of the substrate. The method 1000 proceeds to operation 1008 of forming a number of second metallization layers and second interconnect structures (e.g., the backside vias 372 and 376, the feedthrough vias 374 and 378, the $BV_0$, the $BV_1$, the $BM_0$-$BM_2$) on a backside (e.g., the backside 301B) of the substrate. In various embodiments, the GAA FET devices and the first interconnect structures form a number of the eFuse cells (e.g., an array of the eFuse cells 310), and the second interconnect structures may form a backside power source (e.g., the SPRs 360) coupled to the eFuse cells.

Corresponding to operation 1002, the substrate may be a semiconductor substrate, such as a bulk semiconductor, a semiconductor-on-insulator (SOI) substrate, or the like, which may be doped (e.g., with a p-type or an n-type dopant) or undoped. The substrate may be a wafer, such as a silicon wafer. Generally, an SOI substrate includes a layer of a semiconductor material formed on an insulator layer (or dielectric layer). The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Corresponding to operation 1004, on the frontside of the substrate, a number of GAA FET devices are formed. The GAA FET devices may each be formed by at least some of the following process steps: forming a fin structure (e.g., the active region) protruding from the substrate, wherein the fin structure includes a number of first semiconductor nanostructures and a number of second semiconductor nanostructures alternately stacked on top of one another; forming a dummy gate structure straddling the fin structure; forming gate spacers disposed along opposite sidewalls of the dummy gate structure; recessing portions of the fin structure that are not overlaid by the dummy gate structure (and the gate spacer); replacing respective end portions of each second semiconductor nanostructures with a dielectric material to form a number of inner spacers; forming source/drain structures in the fin structure that are disposed on opposite sides of the dummy gate structure; removing the dummy gate structure; removing the remaining second semiconductor nanostructures; and forming an active (e.g., metal) gate structure (e.g., the gate structures 320 and 330) to wrap around each of the first semiconductor nanostructures. In some embodiments, the first semiconductor nanostructures may be collectively referred to as a channel (e.g., the channels 314 and 324) of the GAA FET device, and the second semiconductor nanostructures being replaced with the active gate structure may be referred to as sacrificial nanostructures.

Corresponding to operation 1006, on the frontside of the semiconductor substrate, the first interconnect structures are formed. The first interconnect structures can include a number of the MEOL interconnect structures (e.g., the MDs, the VDs, the VGs), and a number of the BEOL interconnect structures, including metal lines or tracks and vias (e.g., the M0 tracks 338, 339, and 340; the V0s 341 and 342; the M1 tracks 344 and 345; the V1s 347, 348, and 382; the M2 tracks 350, 351, and 352; the Vn−1 381 and 383; and the Mn track 384), as described above, disposed in various dielectric layers (e.g., ILD layers, IMD layers, ESLs, etc.). The metal lines or tracks and vias formed in their respective dielectric layer(s) are collectively considered a metallization layer, denoted by M0, M1, M2, so on and so forth, arranged one over another on the frontside. In the present embodiments, a fuse resistor (e.g., the fuse resistor 333) of an eFuse cell (e.g., the eFuse cell 310) is included as a metal line or track (e.g., the M2 track 352) in the frontside metallization layer M2.

Each of the first interconnect structures may be formed by depositing a dielectric layer over the frontside; patterning the dielectric layer to form an opening; depositing a metal fill layer in the opening; and planarizing the metal fill layer. A barrier layer may be optionally formed in the opening before depositing the metal fill layer. The metal fill layer may have a composition similar to that of the backside via 240 discussed in detail above.

In some embodiments, the MEOL and BEOL interconnect structures can each extend along in a single direction. For example, the MDs may all extend along a first lateral direction in parallel with the gate structures; the $M_0$ tracks may all extend along a second lateral direction perpendicular to the first lateral direction (in parallel with a lengthwise direction of the channel); and the $M_1$ tracks may all extend along the first lateral direction.

Corresponding to operation 1008, on the backside of the substrate, the second interconnect structures are formed. In some embodiments, the second interconnect structure may collectively function as a heater, some of which may extend along at least one of the first or second direction while some of which may extend along at least one of the first or second direction. The second interconnect structures may be formed by at least some of the following process steps: flipping the substrate; thinning down the substrate from the backside until bottom surfaces of the source/drain structures (or bottom surfaces of dielectric layers underlying the source/drain structures, which are formed prior to epitaxially growing the source/drain structures) are exposed; and forming the second interconnect structures (e.g., the $BV_0$ 362 and 363; the $BV_1$ 365 and 366; the $BM_0$ track 361; the $BM_1$ track 364; the $BM_2$ track 367; the backside vias 372 and 376; and the feedthrough vias 374 and 378), as described above. Second metallization layers are similarly defined as the first metallization layers (except that they are formed on the backside) and include the second interconnect structures provided herein.

As discussed in detail with respect to FIGS. 8-18, the backside vias 372 and 376 and the feedthrough vias 374 and 378 are configured to couple portions of the second interconnect structures on the backside with the first interconnect structures on the frontside. In this regard, the backside vias 372 and 376 and the feedthrough vias 374 and 378 may be formed after thinning down the backside of the substrate and before forming the second interconnect structures. Structures of the backside vias 372 and 376 and the feedthrough vias 374 and 378 as well as the second interconnect structures are similar to those of the first interconnect structures and may be formed in a similar manner as the first interconnect structures as discussed above.

In one aspect, the present disclosure provides a semiconductor structure includes a substrate having a first surface and a second surface opposite the first surface. The semiconductor structure includes a semiconductor device disposed on the first surface. The semiconductor structure includes a metallization layer disposed on the second surface. The semiconductor structure includes a first conductive via and a second conductive via coupled in parallel to the metallization layer, the first conductive via and the second conductive via extending from the second surface toward the first surface. The semiconductor structure further includes an electrical fuse disposed over the semiconductor device and coupled to the first and second conductive vias.

In another aspect, the present disclosure provides a semiconductor structure includes a substrate having a frontside and a backside opposite the frontside. The semiconductor structure includes a semiconductor device disposed on the frontside. The semiconductor structure includes a first metallization layer disposed on the frontside and coupled to the semiconductor device. The semiconductor structure includes a second metallization layer disposed on the backside and configured to provide power to the frontside. The semiconductor structure includes a first via coupled to the second metallization layer and to the semiconductor device from the backside. The semiconductor structure includes a second via coupled to the first via in parallel and extending through at least the substrate to couple the second metallization layer to the first metallization layer. The semiconductor structure further includes an electrical fuse disposed over the first metallization layer and coupled to the first and second vias.

In yet another aspect, the present disclosure provides a method of fabricating a semiconductor device, including providing a substrate having a frontside and a backside opposite the frontside. The method includes forming a semiconductor device on the frontside. The method includes. The method includes forming first interconnect structures coupled to the semiconductor device on the frontside. The first interconnect structures include a first metallization layer and a second metallization layer over the first metallization layer. The second metallization layer includes a fuse resistor. The method further includes forming second interconnect structures on the backside. Forming the second interconnect structures includes forming a first via extending from the backside to a bottom of the semiconductor device. Forming the second interconnect structures includes forming a second via extending from the backside to the first metallization layer, the second via being coupled to the first via in parallel. Forming the second interconnect structures further includes forming a third metallization layer coupled to the first via and the second via on the backside and configured to provide power to the fuse resistor.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a substrate having a first surface and a second surface opposite the first surface;

a semiconductor device disposed on the first surface;

a metallization layer disposed on the second surface;

a first conductive via and a second conductive via coupled in parallel to one another, the first conductive via and the second conductive via extending from the second surface toward the first surface, the first conductive via having a first cross-sectional area, the second conductive via having a second cross-sectional area that is greater than the first cross-sectional area, the first cross-sectional area and the second cross-sectional area being measured in a plane parallel to the first surface or the second surface; and an electrical fuse disposed over the semiconductor device and coupled to the first and second conductive vias.

2. The semiconductor structure of claim 1, wherein the semiconductor device includes a gate structure interposed between a pair of source/drain structures, and wherein the first conductive via is coupled to a bottom surface of one of the source/drain structures from the second surface.

3. The semiconductor structure of claim 2, wherein the gate structure engages with a channel between the pair of source/drain structures, the channel including a plurality of semiconductor layers.

4. The semiconductor structure of claim 2, wherein the metallization layer is a first metallization layer, further comprising a second metallization layer coupled to the semiconductor device, wherein the second conductive via extends through at least the substrate to couple the first metallization layer to the second metallization layer.

5. The semiconductor structure of claim 4, further comprising a third conductive via extending through the substrate to couple the first metallization layer to the second metallization layer, the third conductive via and the second conductive via being coupled in parallel.

6. The semiconductor structure of claim 4, wherein the electrical fuse is disposed in a third metallization layer over the second metallization layer.

7. A semiconductor structure, comprising:

a substrate having a frontside and a backside opposite the frontside;

a semiconductor device disposed on the frontside;

a first metallization layer disposed on the frontside and coupled to the semiconductor device;

a second metallization layer disposed on the backside and configured to provide power to the frontside;

a first via coupled to the second metallization layer and to the semiconductor device from the backside;

a second via coupled to the first via in parallel and extending through at least the substrate to couple the second metallization layer to the first metallization layer; and an electrical fuse disposed over the first metallization layer and coupled to the first and second vias.

8. The semiconductor structure of claim 7, wherein the semiconductor device includes a gate structure interposed between a pair of source/drain structures, and wherein the first via couples the second metallization layer to one of the source/drain structures from the backside.

9. The semiconductor structure of claim 8, wherein the gate structure engages with a channel between the pair of source/drain structures, the channel including a plurality of semiconductor layers.

10. The semiconductor structure of claim 7, further comprising a third via extending through the substrate to couple the second metallization layer to the first metallization layer, the third via and the second via being coupled in parallel.

11. The semiconductor structure of claim 7, wherein the semiconductor device is a first semiconductor device, further comprising:

a second semiconductor device disposed on the frontside and a third via coupled to the second metallization layer and the second semiconductor device from the backside, the third via and the second via being coupled in parallel; and a fourth via extending through the substrate to couple the second metallization layer to the first metallization layer, the third via and the fourth via being coupled in parallel, wherein the third via is disposed between the second via and the fourth via in a top view.

12. The semiconductor structure of claim 7, wherein the semiconductor device is a first semiconductor device, further comprising a second semiconductor device disposed on the frontside and a third via coupled to the second metallization layer and the second semiconductor device from the backside, the third via and the second via being coupled in parallel.

13. The semiconductor structure of claim 12, wherein the second semiconductor device includes a gate structure interposed between a pair of source/drain structures, and wherein the third via is coupled to one of the source/drain structures on the backside.

14. The semiconductor structure of claim 12, wherein the first semiconductor device is disposed in a functional device region and the second semiconductor device is disposed in a dummy device region.

15. The semiconductor structure of claim 7, wherein the first via has a first cross-sectional area and the second via has a second cross-sectional area in a plane parallel to the frontside or the backside of the substrate, the second cross-sectional area being greater than the first cross-sectional area.

16. A method, comprising:

providing a substrate having a frontside and a backside opposite the frontside;

forming a semiconductor device on the frontside;

forming first interconnect structures coupled to the semiconductor device on the frontside, the first interconnect structures including a first metallization layer and a second metallization layer over the first metallization layer, the second metallization layer including a fuse resistor; and forming second interconnect structures on the backside, including:

forming a first via extending from the backside to a bottom of the semiconductor device;

forming a second via extending from the backside to the first metallization layer, the second via being coupled to the first via in parallel; and forming a third metallization layer coupled to the first via and the second via on the backside and configured to provide power to the fuse resistor.

17. The method of claim 16, wherein the semiconductor device includes a gate structure interposed between a pair of source/drain structures, and wherein the first via couples the third metallization layer to a bottom of one of the source/drain structures.

18. The method of claim 16, further comprising, before forming the second metallization layer, forming a third via coupled to the fuse resistor through the first metallization layer from the backside, the third via and the second via being coupled in parallel.

19. The method of claim 16, wherein the semiconductor device is a first semiconductor device, further comprising forming a second semiconductor device on the frontside and a third via extending from the backside to a bottom of the second semiconductor device, the third via and the second via being coupled in parallel.

20. The method of claim 16, wherein a cross-sectional area of the first via is less than a cross-sectional area of the second via in a plane parallel to the frontside.

* * * * *